United States Patent
Mahoney et al.

(10) Patent No.: US 6,315,156 B1
(45) Date of Patent: Nov. 13, 2001

(54) TAPE-FORM PACKAGING SYSTEM AND APPARATUS FOR EFFECTING ASSEMBLY AND DISASSEMBLY THEREOF

(75) Inventors: William A. Mahoney, Dublin; Scott E. Swisher, Lancaster, both of OH (US)

(73) Assignee: GPax International, Inc., Columbus, OH (US)

( * ) Notice: Subject to any disclaimer, the term of this patent is extended or adjusted under 35 U.S.C. 154(b) by 0 days.

(21) Appl. No.: 09/013,795

(22) Filed: Jan. 26, 1998

(51) Int. Cl.[7] ........................................ B65H 5/28
(52) U.S. Cl. ........................ 221/72; 221/74; 221/84
(58) Field of Search ........................ 221/71, 72, 84, 221/87; 206/330, 345, 347, 461, 467

(56) References Cited

U.S. PATENT DOCUMENTS

| | | | |
|---|---|---|---|
| 3,465,874 | * 9/1969 | Hugle et al. | 206/328 |
| 4,560,087 | * 12/1985 | Sato et al. | 221/73 |
| 4,583,641 | * 4/1986 | Gelzer | 206/330 |
| 4,842,135 | * 6/1989 | Borst et al. | 206/328 X |
| 4,844,258 | * 7/1989 | Boeckmann et al. | 206/328 X |
| 5,312,015 | * 5/1994 | Gelzer | 221/72 |
| 5,806,714 | * 9/1998 | Geiger | 221/73 |

* cited by examiner

Primary Examiner—Donald P. Walsh
Assistant Examiner—Gene O. Crawford

(74) Attorney, Agent, or Firm—Robert E. Stebens

(57) ABSTRACT

A tape-form packaging system for conveyance or dispensing of articles and apparatus for assembly and disassembly of the packaging system is disclosed. The packaging system includes elongated carrier and cover tapes disposed in superposed relationship with article retaining pockets formed in the carrier tape in spaced relationship along its longitudinal axis. Cooperative interconnecting components are formed in the two tapes intermediate adjacent pairs of pockets. The component in the carrier tape is a rectangular aperture having opposed ends extending longitudinally of the tape and the component formed with the cover tape is a projection of the same length as the aperture through which it is extended. A tab extends from a side of the projection into underlying, contacting relationship to the carrier tape thereby mechanically interlocking the tapes together in releasable engagement. Assembly of the carrier and cover tapes is effected at an assembly station by a fork and a backup plate positioned at respective opposite sides of the tapes when they are in overlying relationship. Actuating mechanism connected with the fork and plate functions to reciprocate them in opposite directions in a plane transverse to that of the tapes in inserting the projections through the apertures. A sprocket wheel drive mechanism engages linearly aligned rows of holes at the longitudinal side edges of the tapes and is operable to displace the tapes in increments bringing the apertures and projections sequentially to the assembly station. A plate insertable between the tapes separates them while being longitudinally displaced past the plate.

27 Claims, 8 Drawing Sheets

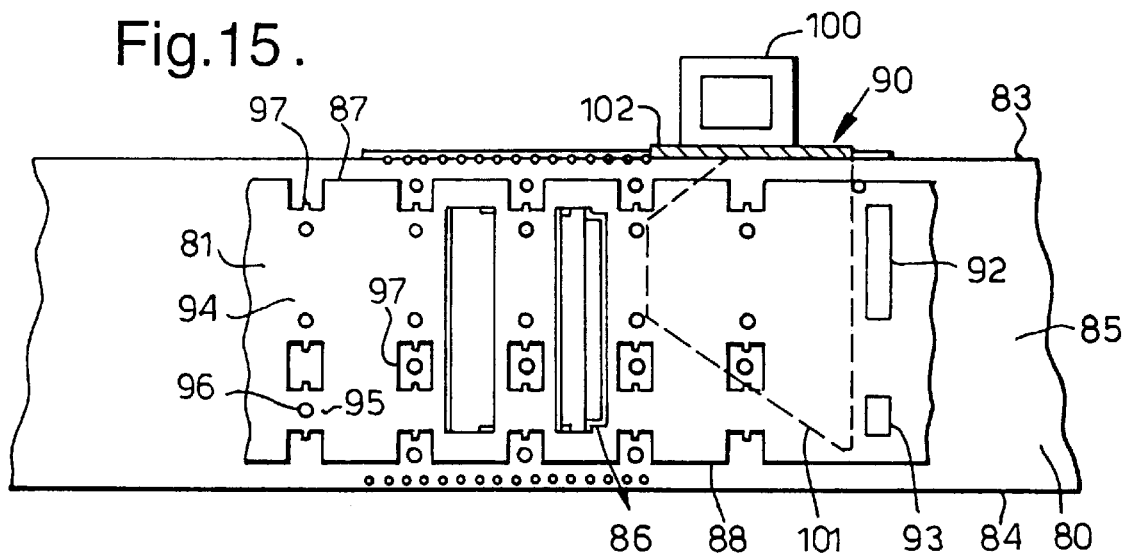
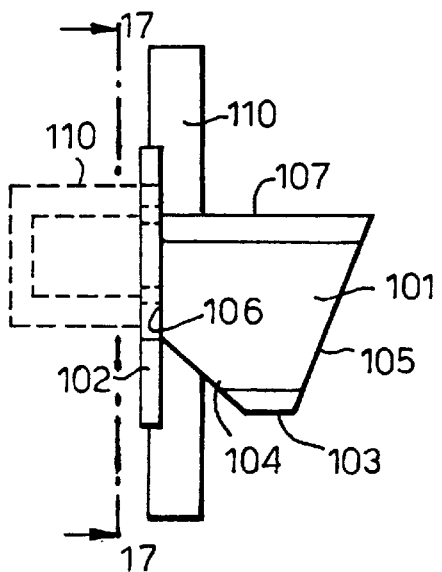
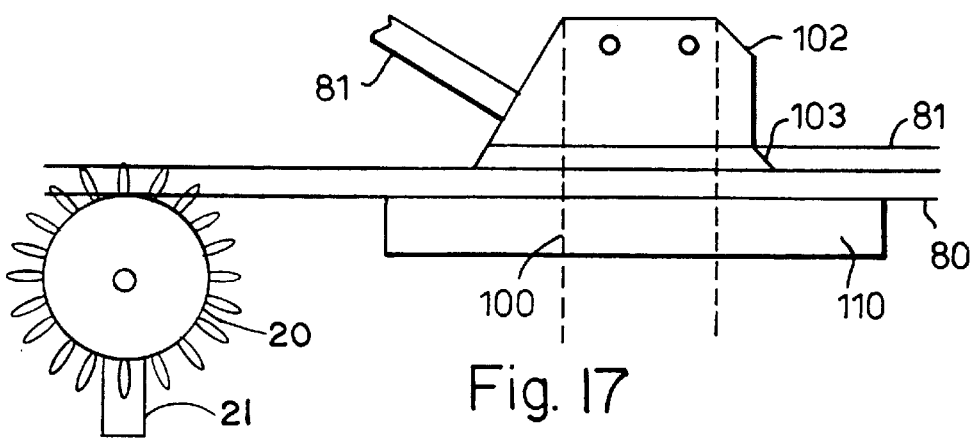

TAPE-FORM PACKAGING SYSTEM AND APPARATUS FOR EFFECTING ASSEMBLY AND DISASSEMBLY THEREOF

FIELD OF THE INVENTION

This invention relates, in general, to a tape-form packaging system for storage, transport and positioning of the articles for seriatim dispensing of those articles at a work station in effecting automation of manufacturing operations. It relates, more specifically, to a packaging system including an elongated carrier tape and an elongated cover tape extending longitudinally of the carrier tape in overlying relationship thereto and cooperatively forming pockets of a predetermined configuration for releasably retaining of a respective article. Intermediate adjacent pockets, the carrier and cover tapes are provided with cooperative elements that cooperatively interfit in interlocking engagement to releasably secure the tapes into unitary relationship. When disposed in overlying relationship and interlocked together, that portion of the cover tape which mechanically interlocks with a portion of the carrier tape has elements that project through cooperatively interfitting apertures formed in the carrier tape. The cover tape is disposed in closely adjacent and coplanar relationship to the opposed surface of the carrier tape surrounding a respective aperture. This invention is also related to apparatus for effecting assembly or disassembly of the tapes.

BACKGROUND OF THE INVENTION

Automation of manufacturing operations has become a common practice in production of many products. It is a frequently employed technique in the case of products which involve assembly of a plurality of components. A principle feature of most automated operations is mechanized feeding of components to a work station where they are assembled with other components to form a subassembly or where they are incorporated into a subassembly or an otherwise completed product. The work station may be manual requiring the presence of a worker who performs the assembly operation or, more advantageously, it also is mechanized to further enhance economy of a products manufacture. Robotic-type apparatus has been devised to perform functions in automated operations such as picking up components delivered to a work station and placing them in a subassembly of a product or in association with another component that is to be incorporated in a subassembly or a major component of a product unit. Automated apparatus is also designed to perform additional fabrication procedures on a component that has been delivered to a work station.

Transport and delivery of components to a work station is a major aspect of these automated manufacturing operations. To achieve that primary objective, it is customary to package the components in association with elongated, flexible tapes with the components being disposed seriatim in relatively spaced apart relationship along the longitudinal axis of the tape at distances compatable with mechanised dispensing and utilization at a work station. These tape packaging systems, while designed primarily to effect transportation of the components, are also frequently of a construction to provide physical protection for the components. This physical protection is often considered essential in the case of electronic components such as solid state devices in the nature of integrated circuit chips having a large number of terminals and associated circuit connecting leads. These terminals and leads are fragile and easily subject to physical damage. Another important advantage of the elongated flexible tapes is that they can be readily coiled for storage and transport to effect conservation of space in addition to being readily adaptive to being placed in operative relationship with apparatus to effect either loading of the components with a tape or in effecting dispensing of the components therefrom.

Packaging systems designed to meet these general objectives have heretofore been devised and utilized in automated manufacturing operations. Examples of prior art tape-form packaging systems intended for use in such automated systems are disclosed in the following listed previously issued U.S. patents:

U.S. Pat. No. 4,583,641 issued Apr. 22, 1986 to John R. Gelzer

U.S. Pat. No. 4,757,895 issued Jul. 19, 1988 to John R. Gelzer

U.S. Pat. No. 5,312,015 issued May 17, 1994 to John R. Gelzer

U.S. Pat. No. 5,472,085 issued Dec. 5, 1995 to John R. Gelzer.

Each of those patents is assigned to GPAX International, Inc., the assignee of this invention. Each of those patents disclose tape packaging systems having the common characteristic of two elongated, strip-form flexible tapes disposed in superposed relationship and mechanically interconnected together to cooperatively secure components therebetween but adapted to be separated to effect dispensing of those components. The disclosed tape systems of each of those patents have a carrier tape and a cover tape which cooperatively form pockets, cavities or receptacles adapted to receive and contain a component. When assembled into a unitary tape structure the combined tapes can be coiled into a relatively compact configuration to minimize space required for storage and transport. When uncoiled and delivered along a longitudinal path to present the components sequentially to a dispensing apparatus at a work station, the carrier and cover tapes are adapted to be separated or otherwise manipulated to enable dispensing of the components.

The first three patents listed in the preceding paragraph disclose tape-packaging structures which can be described or characteristically termed loop-form systems. In each of them the cover tape is formed into a series of elongated loops that extend transversely across the carrier tape and function to enclose the components in cooperation with the carrier tape. These loops are spaced apart along the longitudinal axis of the tapes with adjacent loops being interconnected by portions of the cover tape that project through apertures in the carrier tape and mechanically interlock therewith. These loops project laterally from the surface of the carrier tape and it is not formed with any pockets into which any of the components are disposed.

The fourth listed patent discloses a tape configuration that differs from each of the three loop-type tape systems discussed in the preceeding paragraph in that the carrier tape is provided with pockets for receiving and containing the components. It also differs in that the cover tape comprises an elongated flat strip that overlies the pockets and functions to maintain the components in respective pockets. Fingers integrally formed with the carrier tape mechanically engage with the cover tape to effect its retention but permit the cover tape to longitudinally displace relative to the carrier tape. The objective of this structure is to better enable the tapes to accomodate the difference in longitudinal length of the tapes that occurs as they are coiled into a reel.

SUMMARY OF THE INVENTION

In accordance with this invention, a tape-form packaging system is provided for utilization in automated manufacturing operations. The tape-form packaging system of this invention consists of two elongated, strip-form tapes fabricated from plastic in a thickness to have a requiste degree of structural strength and flexibility to properly function as a tape-form packaging system. One of the tapes is termed "carrier" tape having, as its basic purpose, the function of being the structural base of the packaging system. It is fabricated in a manner to have sufficient structural strength and provide adequate rigidity for maintaining the tape combination with the components in the desired configuration and orientation. The second of these tapes is termed "cover" tape which is releasably secured to the carrier tape. It cooperates with the carrier tape to retain the components in packaged relationship but it is selectively functionable to be disengaged from the carrier tape and enable dispensing of the components at a work station. The cover tape is designed to be relatively more flexible than the carrier tape thereby facilitating its functioning.

In a primary embodiment of this invention, pockets are formed in the carrier tape for receiving and retaining respective components at a predetermined position in seriatim, longitudinally spaced relationship with respect to the longitudinal axis of the carrier tape. Each of the pockets is advantageously of a configuration to cooperatively receive a respective component, or an element of a component, in mechanically engaged relationship and thereby hold the component in a selected orientation for optimum dispensing at a work station as well as storage and transport in the packaging system. These pockets have an open side at a first face of the carrier tape with the components thus able to enter or exit a pocket through that open side.

The cover tape in one major embodiment of this invention is designed to be disposed in overlying, superposed relationship to the first face of the carrier tape. It is formed with a longitudinally extending face that is adapted to be disposed in contacting, coplanar relationship to the first face of the carrier tape and having at least portions thereof which extend in coplanar relationship to the plane of the open side of a respective pocket. Thus, the cover tape also at least partially overlies the component positioned in the pocket. With a component appropriately dimensioned with respect to a pocket, a component is positioned to have surface portions lying in the plane of the open side of the pocket and in contacting engagement with the opposed face of the cover tape thereby resulting in rigid retention of the component. This enhances the physical protective capability of this packaging system.

Retention of the carrier and cover tapes in assembled relationship is effected by cooperative mechanism having respective elements integrally formed in each of the two tapes. One element of this cooperative mechanism includes an aperture formed in one of the tapes at a location which is longitudinally intermediate a pair of adjacently disposed pockets. The other element is integrally formed with the other of the tapes and comprises a projection designed to cooperatively interfit in an aperture and mechanically interlock therewith but is selectively disengageable to permit separation of the tapes thereby enabling a component to be dispensed. These projections have a locking tab integrally formed therewith and oriented to project transversely relative to the longitudinal axis of the tape and interfit against the opposite face of the other tape to thereby effect the mechanical interlocking. Insertion or extraction of the projection is enabled by the flexibility characteristic of the tape which permits the tab to be flexed to a position whereby a projection may be inserted into or withdrawn from a respective aperture.

In an embodiment of this invention designed for packaging of relatively long components, a plurality of transversely spaced but aligned projections are formed in the one tape with each projection positioned to cooperate with a respective one of a plurality of transversely spaced but aligned apertures formed in the other tape. A locking tab is formed on each lateral side of a projection. This results in an interlock having greater strength.

In alternative embodiments of this invention, a locking tab is formed on only one transverse side of a projection. A variation of this embodiment has at least two projections having a single locking tab formed on each projection but with these tabs extending in relatively opposite directions.

The primary embodiment of this invention preferably has interlocking projections and apertures provided at each transversely extending side of a pocket. Alternative embodiments may have the interlocking projections and apertures provided at opposite sides of adjacently disposed pairs of pockets thereby effecting economy of manufacture in those applications where a work station can readily accept two components at a single dispensing operation.

In other alternative embodiments of this invention the cover tape is of a configuration to extend over an article or component retained in the pocket formed in the carrier tape. These alternative embodiments provide advantageous accommodation of articles having unique, non-uniform configurations rather than the parallpiped shape of integrated circuit chips and are better packaged with portions that project above the upper face of the carrier tape.

Apparatus is also provided in accordance with this invention to mechanically interact cooperatively with the cover and carrier tapes in a manner to effect advantageous interconnecting of the tapes in assembled relationship with an article or component or to effect dissasembly for dispensing of an article.

Mechanical interconnection of the tapes is advantageous over adhesive interconnection in that it is a "clean" process. Utilization of adhesives tends to leave excess adhesive as a residue on the surface of at least one tape which may interfere with subsequent manipulation of the articles or components that are packaged in such tape assemblies. Also, mechanical interconnections are not affected by temperature or humidity.

These and other objects and advantages of this invention will be readily apparent from the following detailed description of illustrative embodiments of the invention and the accompanying drawings.

DESCRIPTION OF THE DRAWING FIGURES

FIG. 15 is a top plan view of the tapes in combination with a tape separating device of this invention.

FIG. 16 is a top plan view of the separating device.

FIG. 17 is a side elevational view of the separating device as seen along line 17—17 of FIG. 16.

DESCRIPTION OF THE ILLUSTRATIVE EMBODIMENTS

Figure 1:
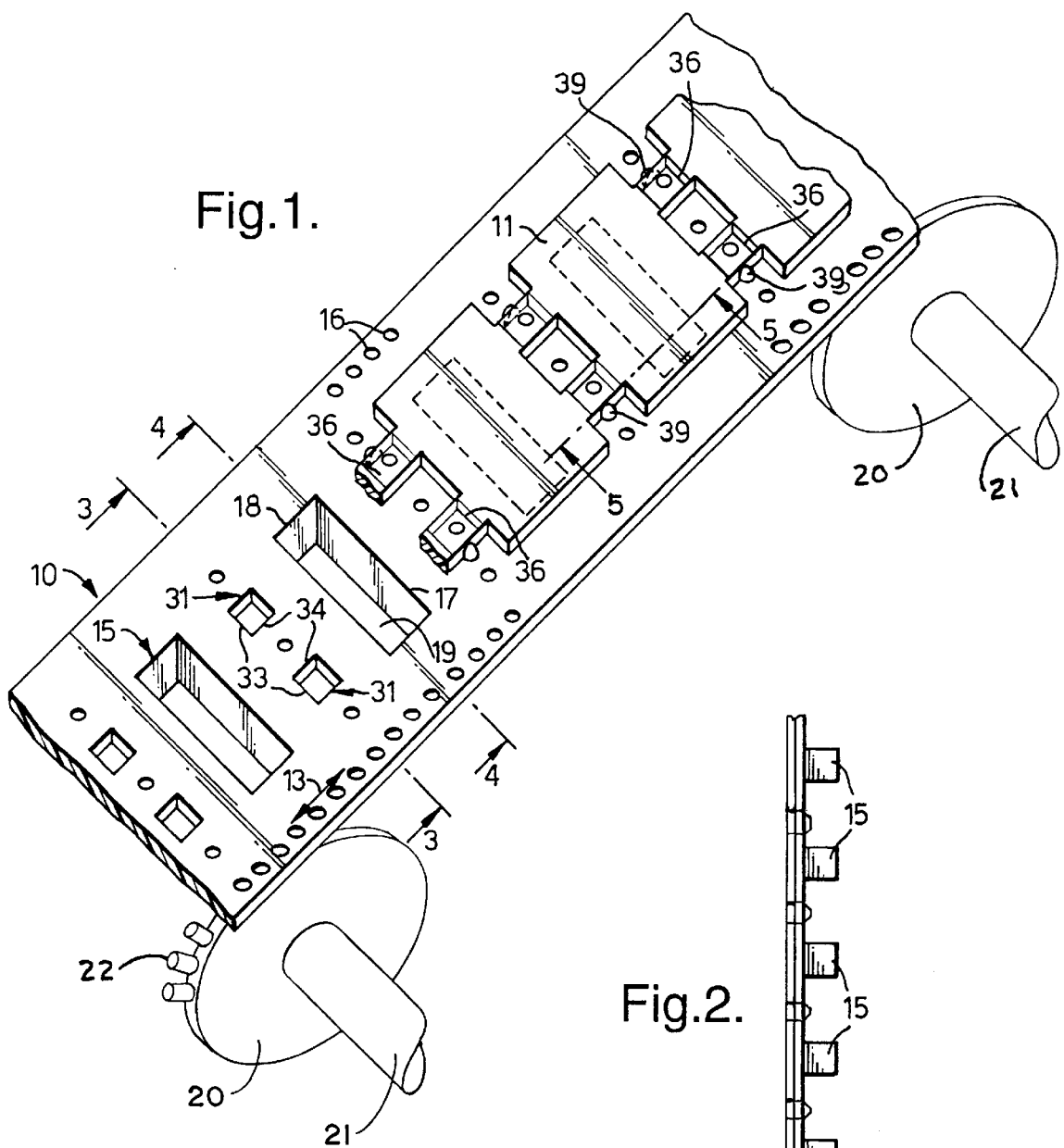
FIG. 1 is a perspective view of an indeterminate length of a packaging system embodying this invention with portions of certain structural elements broken away or shown in section for clarity of illustration.
Figure 2:
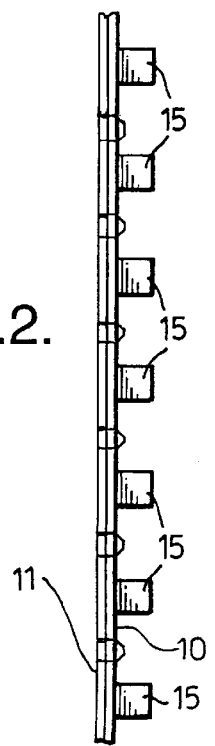
FIG. 2 is a longitudinal side elevational view of the packaging system shown in FIG. 1.

An embodiment of a tape-form packaging system embodying this invention is illustrated in FIGS. 1 and 2 with some of the structural details shown in greater clarity in FIGS. 3–9. Referring to FIGS. 1 and 2, this primary form of the inventive packaging system is seen to comprise two elongated, strip-form tapes disposed in superposed, overlying relationship with these tapes respectively designated as a carrier tape 10 and as a cover tape 11. In this embodiment the tapes are positioned with their adjacent, opposed surfaces in contacting engagement except for the portions that perform the cooperative mechanical interlocking function, a function which will subsequently be explained in detail. Each of the tapes is of an indeterminate length with the two tapes being essentially equal in length to form a packaging system adapted to package an indeterminate number of articles in seriatim, relatively spaced relationship along the longitudinal axis of the tapes. Length of a tape packaging system is dictated to a great extent by the size of reel that can be accommodated by the utilization apparatus as well as the cumulative thickness of the tape packaging system which is primarily dependant on the size of the articles to be packaged thereby. The carrier tape 10 is formed from a relatively thin web of material having adequate structural strength but which exhibits a flexible characteristic enabling the tape to be coiled about an axis disposed transversely to the tape's longitudinal axis into a spiraled, circular configuration thereby forming a reel which is adaptive to automated handling apparatus as well as effecting economy of space for storage or transport.

This carrier tape 10 is of a predetermined width sufficient to accomodate the articles to be packaged and having opposed, longitudinally extending side edges 12 disposed in spaced parallel relationship. The tape includes an upper planar face 13 and a parallel disposed lower face 14 which extend transversely between the side edges 12. Integrally formed with the carrier tape 10 are a plurality of pockets 15 which are of a configuration whereby each will receive a respective article A. In the illustrative embodiment these pockets are of a dimension and shape to project a distance laterally from the lower face 14 of the tape as can be seen FIGS. 2, 3 and 4. Formed in each marginal edge portion of the carrier tape in closely spaced parallel relationship to each side edge 12 is a respective longitudinally extending row of circular apertures 16 with the apertures uniformly spaced apart and extending through the tape. Each of these rows of apertures is adapted to engage with a respective sprocket wheel 20 incorporated in a drive apparatus 21 and operable to effect displacement of the carrier tape 10 along its longitudinal axis. A second set of sprocket wheels 22 is positioned in spaced relation to the first set of sprocket wheels along the longitudinal axis of said carrier tape. These sets of wheels 20 and 22 provide vertical support for the tape and guidance to direction of the tapes movement in view of their sprockets engaging the tapes apertures 16. However, the tape-form packaging system of this embodiment of the invention, as a consequence of unique construction, may be longitudinally displaced by other means as will be subsequently explained.

In the illustrative embodiment the pockets 15 are shown as being of elongated rectangular shape as seen in top plan view in FIG. 1 and are oriented with their longitudinal axes extending transversely across the carrier tape 10. Each of these pockets is formed with spaced parallel, transversely extending sidewalls 17 and having endwalls 18 interconnecting the sidewalls at opposite ends of a pocket. The sidewalls and endwalls are disposed in orthogonal relationship to the carrier tape 10 and its upper and lower faces 13 and 14. A bottom wall 19 interconnects with the lower extremities of the side and end walls in remote relationship to the upper face 13 of the carrier tape. These walls thus define a pocket which has an open top lying in the plane of the upper surface 13 of the tape and through which open top an article A may enter or exit the respective pocket. It will be recognized the pockets may be oriented in other positions such as parallel to the longitudinal axis of the tapes. The pockets may be of many different shapes other than rectangular.

The article A is diagrammatically illustrated as being an elongated rectangular block of a thickness that is essentially equal to the depth of the pocket 15 whereby its upper surface is coplanar with the upper surface 13 of the carrier tape 10. Neither the periphery of the article A nor the walls 17 and 18 of the pocket 15 need be of the illustrated shape. The particular shape illustrated is intended to typify a pocket and article shape. It is a shape that is representative of electronic devices, such as integrated circuit components, which are typical of articles readily adapted to automated assembly operations. The pocket and article may be of many diverse configurations as this tape packaging system is not limited in its use to the electronic component which is diagrammatically illustrated as being a typical article that can be packaged by this tape system. Other pocket configurations would also be shaped to conform closely to the shape of the article with which they are to cooperate thereby effectively holding the article in a fixed position relative to the carrier tape. This is an advantageous feature that aids in the dispensing operation. The specific wall shape may also be modified from that illustrated to a shape that is adapted to enable utilization of robotic picking devices to mechanically engage with the articles and effect their removal from a pocket. In the case of the illustrated article A having a flat upper surface, an article picking apparatus having a vacuum device capable of being selectively secured to the article's flat upper surface may used advantageously. The configuration or shape of a pocket does not form a part of this invention and other pocket and article configurations are illustrated to demonstrate the diversity of this inventive packaging system. A skilled artisan in this art would readily configure the pockets is appropriate for the particular article.

Retention of an article A in its respective pocket 15 is effected by the cover tape 11. This cover tape is also advantageously formed from an appropriate plastic material which exhibits a flexible characteristic when of a suitable thickness to enable it to be coiled about a transverse axis in conjunction with a carrier tape 10 with which it is mechanically joined. Either or both of the carrier and cover tapes 10 and 11 may be formed from a transparent, translucent or an opaque material.

As can be seen in FIG. 1, the cover tape 11 in this embodiment comprises a plurality of pocket cover plates 25 that are spaced a distance apart from each other along the longitudinal axis of the cover tape to position a cover plate over each respective pocket 15. The cover plates are of a transverse width less than the transverse width of the carrier tape and having opposed longitudinally extending side edges 26 that collectively define the respective longitudinal side edges of the cover tape. The cover plates are preferably of a transverse width greater than that of the pockets. With the cover tape centrally aligned relative to the pockets, its side edges are thus spaced a distance relatively inward of the respectively adjacent side edges 12 of the carrier tape 10. The relative widths of the two tapes are designed to avoid having the cover tape 11 in obstructing relationship to the holes 16 in the carrier tape 10 or the associated sprocket wheels of the drive apparatus.

Each of the pocket cover plates 25 is of a length with respect to the longitudinal axis of the cover tape 11 to have its opposite end edges extend a distance beyond the opposite sidewalls 17 of a respective pocket 15. The longitudinally spaced apart end edges 27 of a cover plate 25 are divided into three transversely spaced sections as will be further explained. Each of the cover plates includes a lower planar surface 28 that is disposed in coplanar relationship to and contacting engagement with the upper face 13 of the carrier tape 10. That surface also engages the upper surface of an article A to effect fixing of the article in a respective pocket. Each of the cover plates also includes an upper or outer face 29.

Mechanical interconnection of the carrier and cover tapes 10 and 11 is effected by interconnect means generally designated by the numeral 30. This interconnect means includes cooperatively interfitting apertures 31 formed in the carrier tape 10 and projections 32 integrally formed with the cover tape 11. In the basic illustrative embodiment shown in FIG. 1 and the related FIGS. 3, 5 and 6 these apertures and projections are provided in transversely spaced pairs at locations intermediate adjacent pairs of pockets. Other embodiments of the invention may be constructed with apertures and projections in related groups greater in number than two as well as being provided in single cooperative sets of apertures and projections. The number of sets of apertures and projections is determined by factors such as the length of the pocket, the length of the article to be retained with respect to a pocket and the retentive strength required to maintain an article in the packaging system.

A tape packaging system embodying this invention may be constructed with a plurality of article receiving pockets 15 disposed in transversely aligned relationship as will be subsequently described in greater detail with respect to related drawing figures. Such embodiments would be provided with at least one set of apertures and projections for each combined set of pockets and articles. The number required is determined by the number and size of the pockets and characteristics of the articles or other factors.

Figure 3:
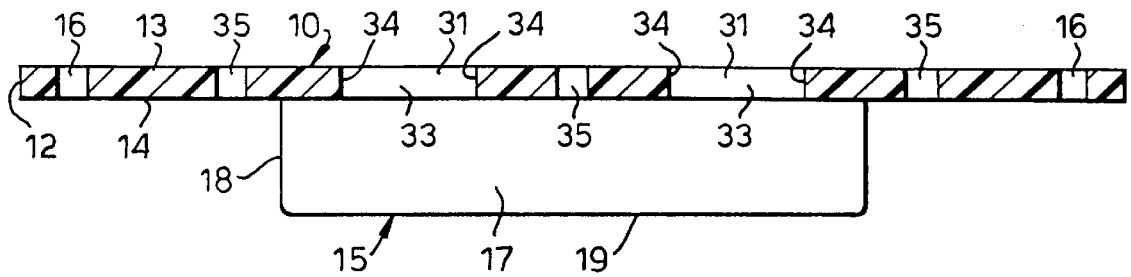
FIG. 3 is a sectional view on an enlarged scale taken along line 3—3 of FIG. 1.
Figure 4:
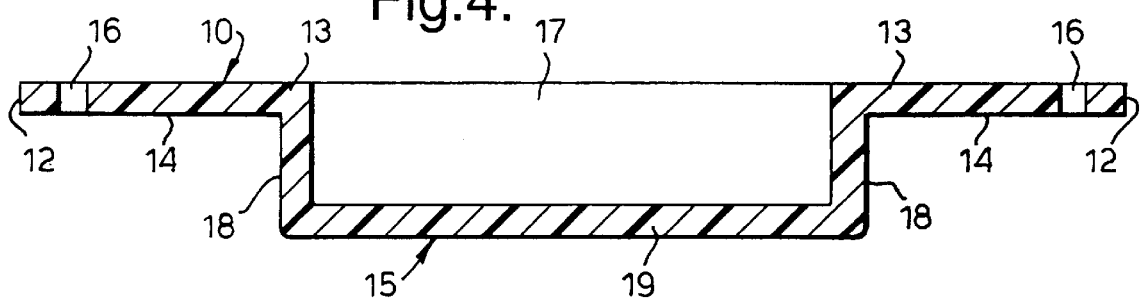
FIG. 4 is a sectional view on an enlarged scale taken along line 4—4 of FIG. 1.

Referring to FIGS. 1 and 3 in further describing the interconnecting means 30, the apertures 31 are described in greater detail, particularly with respect to their orientation relative to each other, placement in the carrier tape 10 and relative to the respective pockets 15. Each of the apertures is adapted to receive a respective projection 32 of the interconnecting means. They are relatively short in length and of rectangular shape in plan view as can be seen in FIG. 1 having spaced parallel side edges 33 extending transversely across the tape and interconnected at their opposed ends by longitudinally extending end edges 34. These apertures are spaced apart along the transverse axis of the carrier tape in spaced relationship to be uniformly disposed between the end walls 18 of the pockets 15. They are also disposed equidistantly between the sidewalls 17 of adjacently disposed pockets. Also formed in the carrier tape along a central axis extending transversely across the tape and through the apertures 32 at their midpoint are three circular apertures 35. One of these apertures is centrally positioned between the apertures 32 with the other two circular apertures positioned a distance laterally outward with respect to the outer ends of the rectangular apertures. These circular apertures 35 are provided to mechanically interengage with a tape assembly mechanism in effecting interengagement of a carrier tape with a cover tape.

An exemplary form of a typical assembly mechanism is illustrated in other drawing figures and described in detail as to its structure and functioning in effecting assembly of a carrier tape and a cover tape with articles into a packaging system of this invention. The tape assembly mechanism is selectively operable during the times of placement of articles A in the pockets to assist in maintaining the carrier tape 10 in a relatively fixed, stable position.

Figure 7:
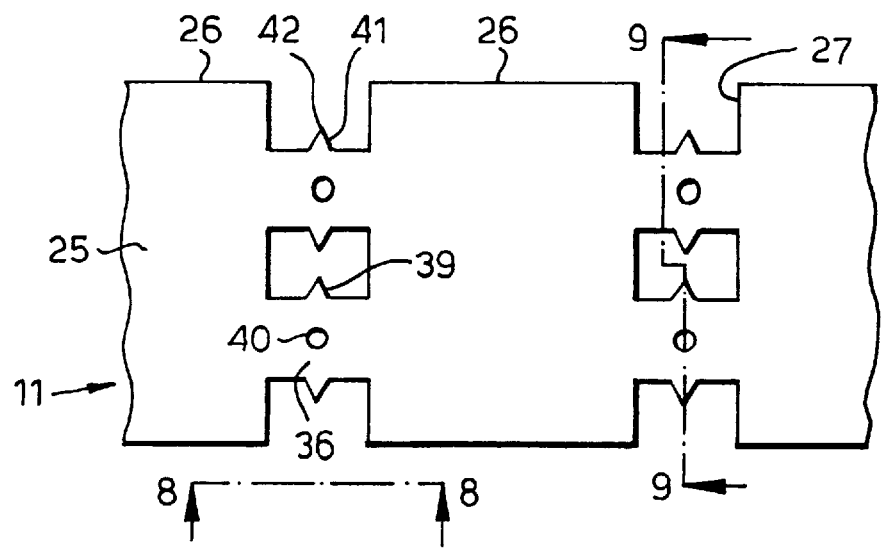
FIG. 7 is a top plan view of a cover tape prior to its formation into the configuration as when assembled with a carrier tape.
Figure 8:
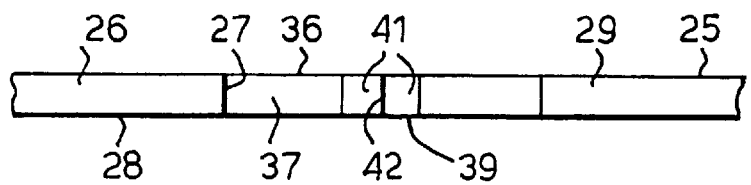
FIG. 8 is a fragmentary side elevational view on an enlarged scale of the cover tape as seen along line 8—8 of FIG. 7.
Figure 9:
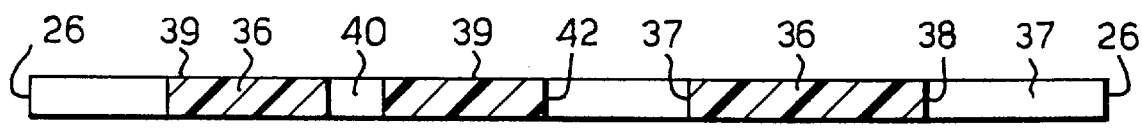
FIG. 9 is a sectional view on an enlarged scale taken along line 9—9 of FIG. 7.

Initially, the cover tape is formed in a flat, sheet form as is shown in plan view in FIG. 7. Interconnecting each pair of adjacent cover plates 25 along their end edges 27 are a pair of integrally formed connector bars 36 of relatively short length and disposed in parallel relationship to each other. These elongated connector bars are transversely spaced apart and located at positions to be aligned with respective ones of the apertures 31 formed in the carrier tape 10. Each connector bar is formed with opposed, longitudinally extending side edges 37 and 38 spaced apart a distance that is substantially equal to the spacing between the longitudinal side edges 33 of a respective aperture 31. Formed with each connector bar 36 at the midpoint between the adjacent cover plates 25 are diametrically opposed tabs 39 which project laterally from each respective side edge 37 and 38. These tabs 39 lie in the plane of the connector bar 36 and are of a length to extend laterally beyond the end edges 34 of a respective aperture 31 in overlapping relationship to a lower face 14 of the carrier tape when the cover tape is assembled therewith.

A circular aperture 40 is formed in each of the connector bars 36 at a central point, both longitudinally and transversely. These apertures cooperate with a component of an assembly mechanism that is operable to mechanically engage with the cover tape 11 and hold it in position relative to the carrier tape 10 when effecting assembly of the two tapes.

Figure 5:
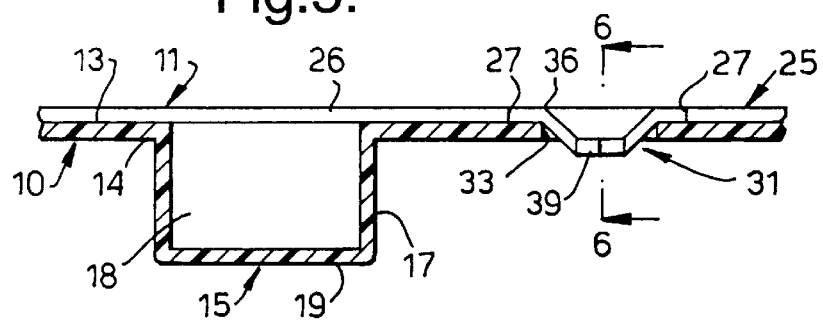
FIG. 5 is a fragmentary sectional view on an enlarged scale taken along line 5—5 of FIG. 1.
Figure 6:
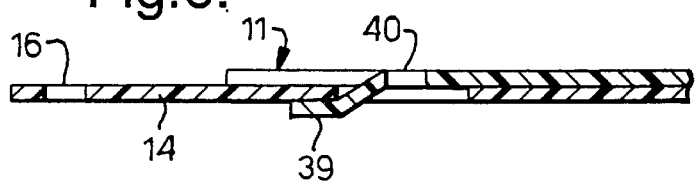
FIG. 6 is a fragmentary sectional view taken along line 6—6 of FIG. 5.

Interconnection of the cover tape 11 with the carrier tape 10 is effected through mechanical interlocking of the two tapes as is best seen in FIGS. 5 and 6. FIG. 1 aids in understanding the relationship of the relevant components of the tapes in effecting the interlocking assembly of those tapes. A cover tape in its planar configuration as fabricated as shown in FIG. 7 is positioned in overlying, superposed relationship to the upper surface 13 of the carrier tape 10 and in contacting engagement with the lower face 28 of the cover tape with the cover plates 25 extending over respective pockets 15 thereby confining an article A in its respective pocket. It is to be understood that FIG. 5 illustrates a portion of the two tapes as seen along a longitudinally extending line, partially in section, showing the tapes as assembled. In particular, this drawing figure shows the cooperative interrelationship of an interconnecting bar 36 on the cover tape 11 after it is deformed into a projection 32 and inserted into a respective aperture 31 of the tape 10 thereby forming in combination therewith an interconnecting means 30.

With the tapes 10 and 11 appropriately positioned longitudinally of each other to place the the connector bars 36 in alignment with respective apertures 31, the tape assembly mechanism is operated to form a projection 32 and insert it into a respective one of those apertures 31. At this point the tape drive apparatus will have been stopped thereby maintaining the carrier tape 10 stationary in a fixed position during the time that the assembly mechanism is operated to form a projection and insert it in a respective one of the apertures. The tape assembly mechanism includes components that support the carrier tape at its lower face 14 adjacent the transverse edges 33 of an aperture 31 to counteract the oppositely directed forces applied to the connector bars 36 in forming the projections 32. The tape assembly mechanism includes pins which are inserted in the respective apertures 35 of the carrier tape and the apertures 40 in the connector bars 36 of the cover tape. These pins aid in stabilizing the respective tapes during the projection formation and insertion operation.

Figure 10:
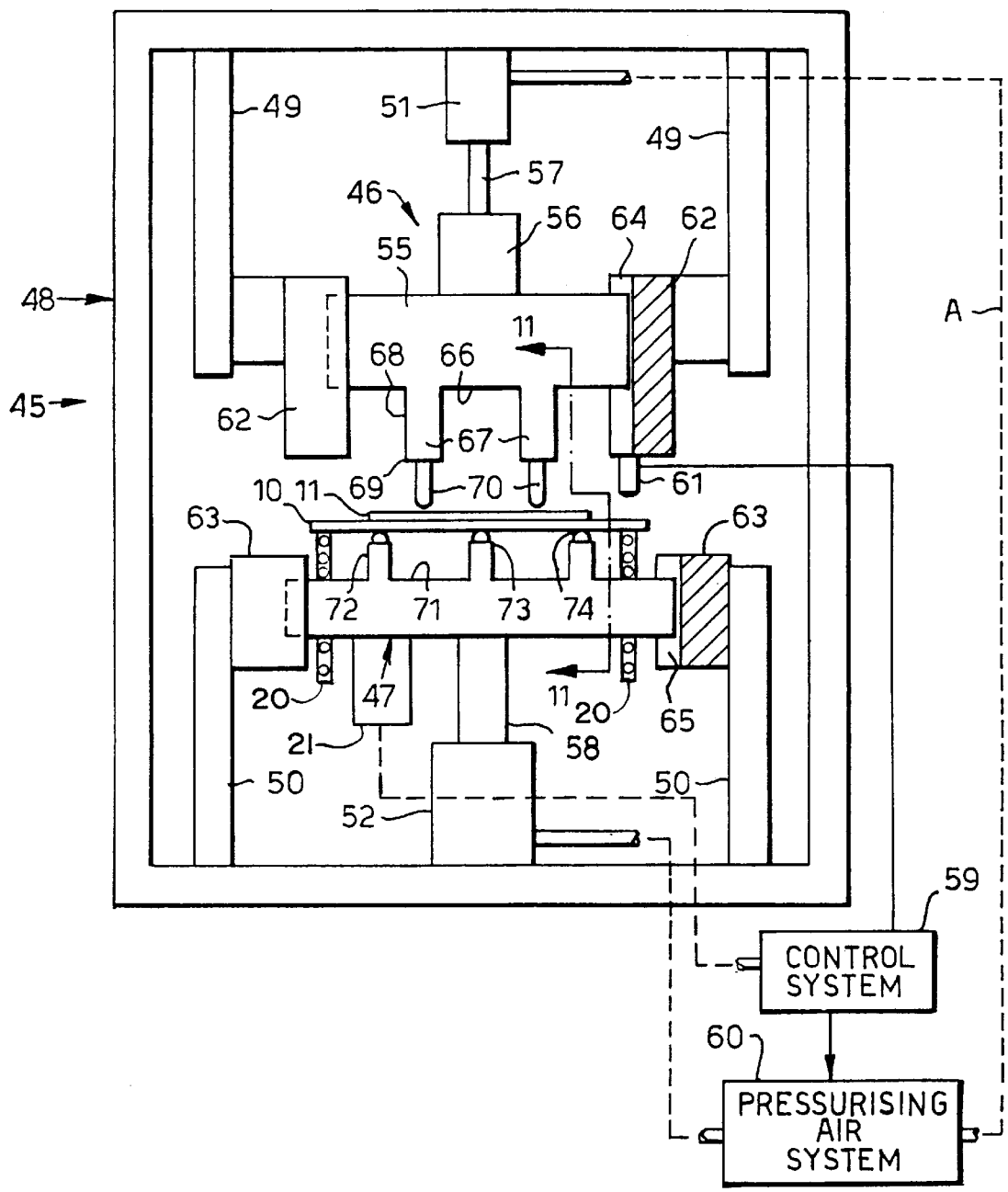
FIG. 10 is an elevational view of a tape assembly mechanism as seen when viewed from one side along the longitudinal axis of the tapes passing therethrough.
Figure 11:
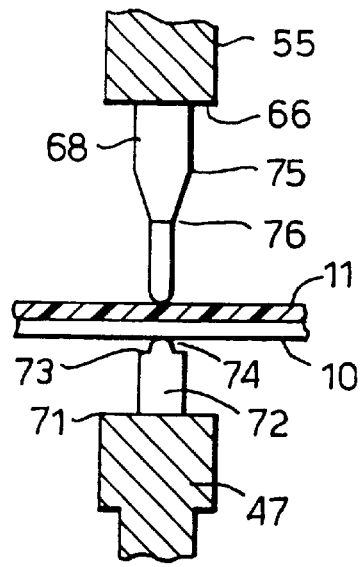
FIG. 11 is a fragmentary sectional view on an enlarged scale taken along line 11—11 of FIG. 10.

A tape assembly mechanism 45 is diagrammatically illustrated in FIGS. 10 and 11 as comprising the two operative elements designated as an interlocking fork 46 and a backup plate 47. These two elements are carried on a supporting structure shown diagrammatically which positions them at respective opposite sides of the tapes when they are disposed in superposed relationship. The supporting structure designated generally by the numeral 48 includes upper and lower frames, 49 and 50, that may be constructed as a unitary structure mounted at a selected location where it is desired to effect assembly of the tapes. Secured to the frames are respective actuating elements 51 and 52 which function to reciprocate the interlocking fork 46 and the backup plate 47 in coaxially aligned relationship along paths which are perpendicular to the plane of the tapes 10 and 11. These actuating elements are illustrated as air operated cylinder and piston devices but other means may be utilized to effect reciprocation of the fork 46 and the backup plate 47.

FIG. 11 is a fragmentary vertical sectional view taken on a transverse plane taken through FIG. 10 but on a substantially enlarged scale to better illustrate the structure of the interlocking fork 46 and the backup plate 47. This illustrated structure is not limitative on the scope of this invention.

The interlocking fork 46 is positioned above the cover tape 11 with which it primarily functions. In its illustrated form it comprises an elongated blade 55 disposed to extend transversely across the cover tape and includes an upwardly projecting support shaft 56 that is mechanically coupled with a piston rod 57 extending from the upper actuating element 51. Positioned beneath the carrier tape 10 is the backup plate 48 that primarily functions with the carrier tape and is mechanically coupled with a piston rod 58 extending from the lower actuating element 52. The two tapes are supported for longitudinal displacement between the interlocking fork 46 and the backup plate 47 when those two components are vertically separated a sufficient distance to be out of contact with the respective tapes as shown in FIG. 10. Separation is of an extent sufficient to also provide adequate clearance to accomodate the articles A which are to be packaged whether disposed in a pocket 15 of the previously illustrated configuration or other shape as shown in other drawing figures and subsequently described as examples. The path of movement of the tapes is along an axis parallel to the longitudinal axis of the tapes which is perpendicular to the transverse sectional view of the tapes as seen in FIG. 10. A set of sprocket wheels 20 with their associated drive mechanism 21 are supported on the assembly frame with the respective sprockets disposed perpendicular to the tape and their sprockets in the tapes holes for displacing the tapes along their path. The drive mechanism is connected with the control system 59 to be operative in effecting tape displacement.

A control system 59 responsive to the longitudinal positioning of the tapes is provided and operative to effect operation of a pressurized air system 60 coupled with the actuating elements 51 and 52 at a predetermined time in relationship to the longitudinal displacement of the tapes relative to the tape assembly station. The control system 59 includes a sensor 61 disposed at a position to determine the longitudinal position of the tapes relative to the interlocking fork 46 and the backup plate 47 to effect stopping further longitudinal displacement of the tapes when their interconnecting means 30 at a particular point is in alignment with the fork and backup plate.

Figure 12:
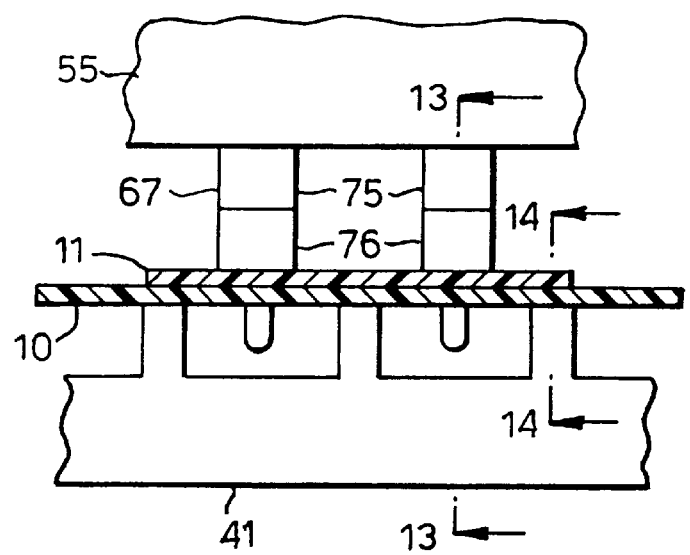
FIG. 12 is a fragmentary elevational view on an enlarged scale of the interlocking fork and backup plate displaced to a position in effecting interlocking of the tapes.
Figure 13:
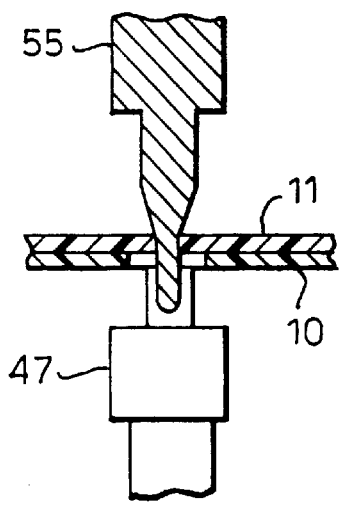
FIG. 13 is a sectional view taken along line 13—13 of FIG. 12.
Figure 14:
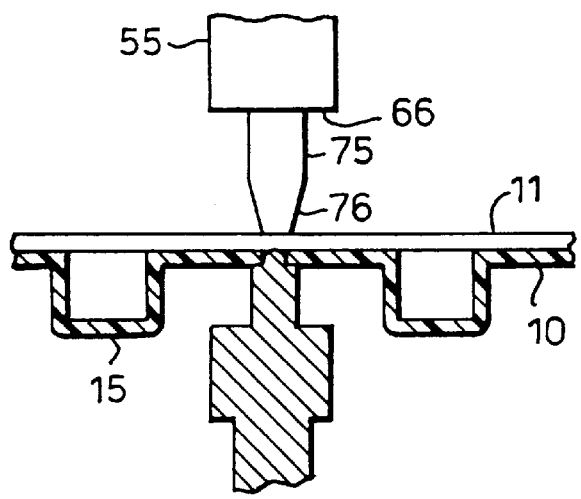
FIG. 14 is a sectional view taken along line 14—14 of FIG. 12.

When the tapes are properly positioned with respect to the fork and backup plate as detected by the sensor 61, the control system 59 is activated and sends a signal to the pressurized air system 60 resulting in application of air under pressure to each of the actuating elements 51 and 52 causing their respective piston rods to extend. Extension of the respective piston rods results in displacement of the interlocking fork 46 and the backup plate 47 toward each other and into operative engagement with the tapes 10 and 11. This interaction of the components with the tapes is shown in FIGS. 12, 13 and 14 and their operation in functioning to effect interconnection of the two tapes in mechanically interlocked relationship will be described in further detail.

In this illustrative embodiment of a tape assembly mechanism, guide means are provided to maintain the fork 46 and backup plate 47 in proper transversely oriented position to the tapes during the course of their reciprocating movement. This is necessary to assure the tape engaging elements of those components will be correctly aligned with the respective apertures and intervening surfaces of the respective tapes. As can be seen in FIG. 11, each of the interlocking fork and the backup plate are of relatively thin configuration. Thickness of these components is minimized to be of the order of the longitudinal length of the apertures. The guide means comprises respective sets of guide rails 62 and 63 that cooperatively engage opposite marginal end portions of the associated interlocking fork 46 and the backup plate 47. These guide rails 62 and 63 are mechanically attached to the upper and lower frames 49 and 50, respectively. Each guide rail is formed with a respective elongated groove 64 and 65 that receives the marginal end portion of a respective one of the fork and backup plate. These grooves are of width to closely interfit with the respective fork or backup block to maintain their alignment relative to the tapes but permit their vertical reciprocation in effecting interlocking connection of the tapes.

The illustrative tape assembly mechanism 45 shown in FIG. 10 is designed to function with the tape system illustrated in FIGS. 1–9. That tape system comprises a carrier tape 10 and a cover tape 11 positioned in superposed relationship to each other and of a design configuration adapted to be mechanically interlocked together forming a unitary packaging system with respect to a plurality of articles A. This tape system has an interconnecting mechanism wherein the cover tape 11 is formed with two parallel interconnecting bars 36 extending longitudinally between each pair of adjacently disposed cover plates 25. Each bar 36 is provided with a laterally projecting V-shaped tab 39 at each of the opposite side edges 26. The tabs and adjacent portions of the bars are designed to be projected through a respective aperture 31 formed in the carrier tape 10 in effecting mechanical interlocking of the tapes in forming of the packaging system.

To accomplish projection of the bars 36 with their associated tabs 39 through an aperture, the blade 55 of the interlocking fork 46 is provided at its bottom edge 66 with a pair of laterally spaced plungers 67. Each of these plungers is formed with a base block 68 integrally formed with the blade and extending a relatively short distance downwardly from the blade's bottom edge 66 terminating in an end edge 69 adapted to contactingly engage with the upwardly facing surface of a respective connector bar 36. Centrally positioned on each plunger 67 in axially projecting relationship to the end edge 69 thereof is an integrally formed pin 70. These pins are of circular cross-section and of a diameter to enable insertion through a respective aperture 40 formed in a connector bar 36.

Integrally formed with the backup plate 47 along an upper edge 71 thereof are three support blocks 72 terminating in upwardly facing support surfaces 73. These support blocks are spaced apart and located to receive a plunger 67 between adjacent pairs of support blocks. The surfaces 73 are adapted to contactingly engage the lower face 14 of the carrier tape 10 and provide vertical support during a tape assembly operation. Formed on the surfaces 73 are respective hemispherically shaped protuberances 74 that project into respective apertures 31 formed in the carrier tape. Their function is to maintain the carrier tape in a fixed position during a tape assembly operation.

Operation of the tape assembly mechanism 45 in effecting assembly of a carrier tape 10 with a cover tape 11 to package an article A is described with reference to FIGS. 12, 13 and 14. This description is also made with specific reference to a tape packaging system utilizing tapes of the configuration as shown in FIGS. 1–9. However, it is to be understood that neither the specific structure of the tape assembly mechanism nor the configuration of tapes as illustrated and described are to be limitative on the scope of this invention.

FIGS. 12, 13 and 14 show the relevant components of the interlocking fork 46 and the backup plate 47 in a relatively closed position clamping the tapes together. Those drawing figures are on an enlarged scale compared to FIG. 10 for clarifying functioning of those components with the tapes in effecting interlocking of the components of the tape interlocking means 30. In these figures the fork 46 and plate 47 have been vertically displaced toward each other to bring respective components of each into operative engagement with the tapes 10 and 11. When in this position, these components effect projection of the portion of each connector bar 36 in the cover tape 11 having the tabs 39 associated therewith through a respective aperture 31 formed in the carrier tape 10.

The projection formation mechanism engages the upper surface 29 of the cover tape at the connector bars 36 with its pins 70 inserted in the apertures 40. The protuberances 74 on the support surfaces 73 of the support blocks 72 carried on the upper edge 71 of the backup plate 47 are projected into the apertures 31 formed in the carrier tape 10 to aid in effecting stabilization of the two tapes relative to each other. Concurrently, the support surfaces 73 on the top of the support blocks 72 carried on the backup plate 47 engage the bottom surface 14 of the carrier tape 10. Thus, these support blocks 72 provide vertical support and maintain the carrier tape at a fixed elevation while the connector bars 36 are projected through the carrier tape's apertures 31 during assembly of the tapes into interlocked relationship at the assembly station which is defined by the tape assembly mechanism 45. The backup plate is thereby effective in counteracting the downwardly directed force which is applied to the cover tape at the connector bars 36 by the interlocking fork 46.

Referring to FIG. 13, it will be seen that the bottom marginal end portions of the plungers 67 are inwardly convergent from their respective vertically disposed, transversely extending sidewall surfaces 75. These inwardly convergent end surfaces designated by the numeral 76 terminate in the end edge 69 which is of spherical shape in cross-section. That terminal end has a cross-sectional width substantially equal to the base width of the V-shaped tabs 39. This dimensioning has the advantage of minimizing the extent of the connector bars 36 that must be projected through an aperture 31 in the carrier tape 10 to effect the mechanical interlocking.

During displacement of the interlocking fork 46 toward the cover tape 11, the end edges 69 of the base blocks 68 of the plungers 67 carried on the bottom edge 66 of the blade 55 contact the upper surface of the associated portions of the connector bars 36 and project those portions of the bars into and through a respective aperture 31. As the bars are projected through an aperture, the tabs 39 are forced past the end walls 34 of an aperture and are bent upwardly when passing the end walls of the aperture along with the adjoining marginal edge portion of the connector bar as is necessary to enable those components to move through the aperture. Through appropriate dimensioning of the several components of the tape assembly mechanism 45, displacement is to the extent necessary to permit the tabs 39 to spring back to their normal position which is extending laterally outward from the respective side edges 37 and 38 of a connector bar 36 but underlying the lower face 14 of the carrier tape as shown in FIG. 13. Although the connector bar is initially displaced through an aperture to a greater extent than shown in FIG. 13, the resilient characteristic of the plastic cover tape 11 will return the projections 32 to the configuration shown in FIGS. 5 and 6. As the interlocking fork 46 is displaced upwardly at the conclusion of the interlocking operation, the tabs 39 will move upwardly and be lying flat against the bottom surface of the carrier tape 10.

During formation of the projections 32 in association with the sets of transversely aligned apertures 31 between a pair of adjacent but longitudinally spaced apart pockets 15 it will be recognized that the tapes will have been assembled and secured together at the immediately preceeding pair of pockets by the interconnecting means 30. They will have been mechanically interlocked together by the cooperative interaction of the apertures 31 and projections 32. It will be understood that articles A are deposited into the pockets 15 in immediately preceding relationship to the pockets with the articles and associated portions of tape entering the tape assembly mechanism.

The preceeding detailed description of a tape packaging system embodying this invention and its combination with the tape assembly mechanism 45 clearly illustrates the advantageous structure of the components and their cooperative interaction. A flat-pack interconnection of the two tapes as can be effected by this illustrated and described structure provides certain advantages over prior art tape-form packaging systems such as those disclosed in the previously noted Gelzer patents. Three Gelzer patents can be generally described as having loops formed in the cover tape and are projected through apertures formed in the carrier tape in effecting mechanical interlocking of the two tapes. This results in a relatively large sized loop extending a significant distance laterally outward from the bottom surface of the carrier tape thus increasing the possibility of mechanical interference with portions of adjacently disposed parts of a coiled tape or with associated tape manipulating apparatus. The flat-pack interconnection of the two tapes achievable by the interconnecting means of the tape packaging system disclosed herein results in the mechanically connected portions of the tapes being positioned in coplanar, contacting engagement. A significant advantage of this configuration is the minimal projection of any components laterally with respect to either the upper or lower surfaces of the tapes at their point of interconnection. This interconnection can be likened to stitching, as in sewing, and may at times, in this disclosure, be referred to as "stitchlock".

Another significant advantage is that the tape interconnecting means 30 effects mechanical interconnection of the carrier tape 10 with a cover tape 11. Mechanical interconnection is preferred over adhesive interconnection as is shown in the previously noted Gelzer patents. One reason mechanical interconnection is highly desirable over adhesive connection is that it is a "clean" process not requiring continuous monitoring of heat parameters as is the case with either heat sealed or sonic welded tapes. Both adhesive connected and sonic welded tapes are difficult to separate. Adhesives have a relatively short shelf life which results in separation of the tapes at a possibly premature time. This is something that does not happen with mechanical interconnection.

Mechanical interconnection also has the advantage of enabling longitudinally successive tapes to be spliced together at their adjacent ends. Splicing may be effected by appropriate mechanical devices such as staples. This provides the convenience of having a continuous, uninterrupted tape supply for either assembly of the carrier and cover tapes along with an article or their disassembly at a dispensing station.

A further significant advantage of the mechanical tape interconnection technique disclosed herein is that the cover tape 11 will lie in a flat, coplanar relationship to the adjacent, opposed surface of the carrier tape 10, such as is the case with the case with the embodiment shown in FIG. 1. This results in a tape assembly having a top cover tape surface which is essentially uninterrupted throughout its entire length thereby facilitating coiling of the assembled tapes into reels for convenience of storage or transport and for uncoiling at a utilization station for dispensing of the articles. Additionally, the assembled tapes are of a compact configuration requiring less material of the cover tape be utilized in effecting mechanical interconnection of the tapes.

Separation of the carrier and cover tapes 10 and 11 to enable removal of the articles A, such as at a dispensing station where they are to be utilised, can be effected by different techniques and apparatus. One technique comprises pulling the tapes apart by mechanical means. This technique generally consists of holding the one tape, such as the carrier tape 10, to prevent its being displaced perpendicularly with respect to its transverse plane while pulling the cover tape 11 away resulting in the projections 32 being stripped out of their respective apertures 31. This action flexes the tabs 39 as they pass through an aperture. The cover tape 11 may be coiled into a reel to facilitate its transfer to a disposal station. Similarly, the carrier tape 10, after the articles A are removed from their respective pockets 15, may be coiled onto a reel for transfer to a disposal station or it may be reutilized in packaging of other articles by being combined with another cover tape in accordance with the previously described technique.

A particularly advantageous tape separation technique and tape separating apparatus for effecting functioning of this technique is shown in FIGS. 15, 16 and 17. It is designed for functioning with a carrier tape 80 and a cover tape 81 that are of a construction similar to the previously described tapes 10 and 11. These tapes 80 and 81 also are mechanically interconnected by interconnecting means 82 which functions in a manner that is essentially the same as the previously described interconnecting means 30. In view of their structural similarities, these tapes 80 and 81 will only be described in generalities and with reference to the functioning of the previously described tapes 10 and 11.

Carrier tape 80 is of a predetermined width having opposed, longitudinal side edges 83 and 84. It is formed from a flat strip of suitable plastic material exhibiting a requisite degree of flexibility and having an upper surface 85 and a lower surface 85a. A plurality of article receiving pockets 86 that are each adapted to receive a respective article B are formed in the carrier tape. These pockets are of an elongated rectangular configuration extending transversely across the carrier tape in longitudinally spaced, seriatim relationship with open tops lying in the plane of tape's upper surface 85 and through which an article B may enter or exit a pocket.

The cover tape 81 is also formed from a flat strip of suitable plastic material exhibiting a requisite degree of flexibility. Similar to the previously described tape packaging system, this cover tape is longitudinally aligned with the carrier tape 80 and positioned in superposed relationship thereto. It also is of elongated configuration with opposed, longitudinal side edges 87 and 88 defining a tape having a transverse width that is less than that of the carrier tape but greater than the transverse dimension of the pockets 86. As is best seen in FIG. 17, the cover tape 81 has a bottom surface 89 and is shown both in assembled relationship with a carrier tape 80 with their respective bottom and upper surfaces in contacting engagement with articles B packaged therewith and then separated therefrom to enable dispensing of the articles. This cover tape 81, as is the carrier tape 80, are shown in FIG. 17 in side elevation in operative relationship with the primary component of the particular tape separating mechanism generally designated by the numeral 90 and which is illustrated and described in this specification.

Mechanical interconnection of the tapes 80 and 81 is effected by the interconnecting means 82 which is similar in both structure and function to the interconnecting means 30 described and illustrated with respect to the tapes 10 and 11. This interconnecting means 82 described with reference to FIG. 15 also includes a plurality of circular apertures 91 and rectangular apertures 92 and 93 disposed in transversely aligned sets formed in the carrier tape intermediate each pair of adjacently disposed pairs of pockets 86. Formed in the cover tape 81 are transversely aligned sets of connector bars 94 and 95 which are aligned with sets of circular apertures 96. Each of the connector bars is formed with tabs 97 that project laterally from respective sides of a bar and are adapted to underlie the carrier tape 80 in effecting mechanical interlocking of the tapes in the same manner as described with respect to the tapes 10 and 11. This interconnection means 82 also produces a flat-pack tape packaging system that is particularly advantageous in packaging of articles B which permit the cover tape 81 to lie flat on the carrier tape 80 and the upper flat surface of the articles.

A major difference between the two tape packaging systems is the spacing and length of the apertures 92 and the connector bars 94,95 extending transversely across the tapes and cooperatively forming respective interconnecting means 82. As can be seen in FIG. 15, the connector bars 94 adjacent side 87 of the cover tape 81 are of substantially greater transverse width than that of the connector bars 95 adjacent the opposite side edge 88 of the cover tape. The corresponding rectangular apertures 92 in the carrier tape 80 and into which the connector bars 94 interfit along with their respective tabs 97 is of a similar length. This greater length was found advantageous in cooperating with the tape separating mechanism 90 as will become more apparent with subsequent detailed description of a tape separating operation utilizing this mechanism.

Interconnection of the tapes 80 and 81 to form a packaging system is accomplished in a manner similar to that previously described with reference to the first described packaging system formed from carrier and cover tapes 10 and 11. The tapes 80 and 81 may also be advantageously connected utilizing a tape assembly mechanism similar to that shown in FIGS. 10–14 but modified to the extent necessary to be dimensionally compatible with the transverse spacing of their respective circular and rectangular apertures. An assembly mechanism for the tapes 80 and 81 is operated in the same manner described with reference to FIGS. 10–14 to project the connector bars 94 and 95 through the respective rectangular apertures 92 and 93 formed in the carrier tape. This results in the tabs 97 being disposed in contacting engagement with the lower surface 85a of the carrier tape 80 and to thereby effect mechanical interlocking of the tapes.

Disassembly of the tapes 80 and 81 is preferably effected in relatively close physical proximity to a location where the articles B are to be utilized. A "use station" is not illustrated in FIG. 15 but would be expected to be located near the end of the carrier tape 80 at the right side FIG. 15. In that figure the tapes are being displaced along their longitudinal axis disposed parallel to the longitudinal side edges 83 and 84 of the carrier tape 80. The direction of displacement is from the left to the right side of FIG. 15. Spacing of the "use station" from the tape separating mechanism 90 is of a distance to permit removal of the cover tape 81, after its separation from the carrier tape 80, to a location where it will not interfere with pickup of the articles B out of their respective pockets 86. FIG. 17 provides a diagrammatic illustration of a typical path of movement of the cover tape after it is separated from the carrier tape. It is directed along a path that extends in a generally upward direction from the carrier tape to a location (not shown) where disposal is effected or where it is wound on a reel. The objective is to move it away from the carrier tape so that it will not be in an obstructing relationship to the now exposed pockets thereby avoiding interfering with removal of articles from the pockets.

The tape separating mechanism 90 is located at a separating station and includes a supporting frame 100 fixed to a base structure [not shown]. This results in the separating mechanism being maintained in a fixed position relative to the tapes 80 and 81 while performing the separating operation. Supporting frame 100 is only diagrammatically shown and is illustrated as comprising a vertically disposed post which is mechanically secured to the operative elements of the separating mechanism. The primary component of the tape separating mechanism is a tape separating plate 101 carried on a mounting bracket 102 secured to the supporting frame's vertical post. The separating mechanism is disposed adjacent the longitudinal side edge 83 of the carrier tape 80. Portions of the supporting frame 100 that are immediately adjacent the longitudinal side edge 83 of the carrier tape 80 are laterally offset therefrom a sufficient distance to avoid interfering with longitudinal displacement of the tapes.

This separating plate 101 is a flat, relatively thin, structurally rigid device designed to be projected in coplanar relationship between the opposed upper surface 85 of the carrier tape and the bottom surface 89 of the cover tape. It is of a generally triangular shape in plan view as seen in FIGS. 15 and 16 having a front end edge 103 that is disposed to extend in transverse orientation to the tapes. In FIG. 15 the separating plate is in underlying relationship to the cover tape and, therefore, is shon in broken lines. This separating plate is positioned with the front end edge projecting in the direction of the approaching tapes. It has opposed side edges 104 and 105 that extend rearwardly in divergent relationship from this plates front edge 103 with the side edge 104 terminating in a longitudinal side edge 106 that is rigidly secured to the mounting bracket 102. At the trailing end of the separating plate 101 is a transversely extending rear end edge 107 which interconnects with the respective trailing ends of the one divergent side edge 105 and that of the longitudinal side edge 106. As can be best seen in FIG. 17 the front edge 103 the separating plate 101 is formed with an inclined surface 108 which slopes upwardly and rearwardly from the bottom surface 109 of the plate.

Referring to FIGS. 15 and 17, functional operation of the plate 101 is diagramatically illustrated and the following description of a typical operation is directed to those figures. Referring first to FIG. 15, the advantage of constructing the cover tape 81 with a wide connector bar 94 adjacent its longitudinal side edge 87 is to better functioning with the separating plate 101. Providing of a relatively wide connector bar 94 enables the separating plate to have a correspondingly wide front edge 103. As the tapes 80 and 81 are displaced to the right as referenced to FIG. 15, the leading side of the transversely extending wide connector bar 94 engages the front edge 103 of the plate 101. With continued relative displacement, the connector bar rides up the inclined surface 108. This results in lifting of the connector bar 94 along with pulling the associated tabs 97 upwardly out of the associated long rectangular aperture 92 formed in the carrier tape 80. At this stage of the tape separating operation, the divergent side edges 104 and 105 of the separating plate 101 become effective in assisting in upward displacement of the tabs 97. Upon further longitudinal displacement of the tapes with respect to the tape separating plate, the plate will progressively lift the cover tape 81 in a direction transversely across the tapes. This progressive transverse lifting of the cover tape progresses at a rate in accordance with the angle of divergence of the plate's side edge 105. The rear end edge 107 of the separating plate is of a dimension to extend transversely across the tapes a sufficient distance to engage the narrow connector bar 94 and effect removal of its locking tabs 97 from the associated short rectangular aperture 93.

One advantage of the relatively wider connector bar 94 is that the front edge 103 of the separating plate may be of a width corresponding thereto. This results in an initial lifting effect distributed over a greater transverse width than could otherwise be effected by use of only narrow connector bars such as 95.

The separating plate 101 performs at least two additional important functions. One is that it aids in maintaining the carrier tape 80 relatively stable in a predetermined plane as it passes through the tape separating station. As the interconnecting means 82 is disengaged, the tabs 97 tend to spring quickly out of engagement with the carrier tape 80 due to the resilient characteristic of the flexible material from which the cover tape is formed. This results in the cover tape 81 tending to vibrate to a significant degree with that vibration likely to be transmitted to the carrier tape 80 and perhaps cause an article B to be prematurely dislodged from its respective pocket. This is prevented by the tape separating plate 101 which overlies the carrier tape and is in contacting engagement with its upper surface 85. The carrier tape is vertically supported on its lower surface 85a by apparatus which could consist of components of a set of sprockets wheels and associated drive mechanism or a shuttle-type tape displacing mechanism such as that previously described. This vertical support could also comprise longitudinally extending support rails 110 disposed adjacent the respective longitudinal side edges 83 and 84 of the carrier tape in contacting engagement with the tape's lower surface 85a such as is diagrammatically shown in FIG. 17. The articles B are thus retained in their respective pockets 86 as the carrier tape is displaced through the separating station and likely remain in the pockets as the carrier tape continues its displacement toward the article "use station" even though the cover tape 81 has been removed.

Another important function is that the tape separating plate 101 serves to maintain the articles B in their respective pockets 86 during the tape separating operation. Immediately after separation of the tapes at one transversely extending interconnecting means 82, the front edge 103 of the separating plate 101 will slide over the upper surface of the next succeding article B prior to the front edge 103 being brought into contact with the cover tape 81 at the next transversely extending interconnecting means.

The tape separating system and apparatus illustrated in FIGS. 15, 16 and 17 and described in the preceding paragraphs with respect to those figures is particularly advantageous to be utilized with the previously illustrated flat pack-type tape packaging systems. One major structural aspect of this invention that contributes significantly to its advantages over other packaging systems of this type is the interlocking means for effecting mechanical interlocking of the carrier and cover tapes. This interlocking means which has been referred to as a "stitch-lock" provides a secure interconnection having a relatively flat profile and does not have any components that project a significant distance either above or below the planes of the tapes. That structural feature minimizes the likelihood of interference with other apparatus that is utilized in handling of this tape-form packaging system in either effecting assembly with an article to be packaged or effecting disassembly for dispensing of the articles.

The tape-form packaging system shown in FIGS. 15, 16 and 17 in combination with the tape separating apparatus is an exemplary form of the invention. It is not limitative on the scope of this invention as the principles of the illustrated tape separating apparatus may be embodied in apparatus designed for the same functional purpose but of a different structural configuration specifically adapted for use with tapes of other configurations. For example, the tape separating plate may have a front edge which is of a lessor width to better enable its use with cover tapes having only the narrow connector bars such as are shown in the embodiment illustrated in FIGS. 1–9. Also, in the case of a cover tape having four or more connecting bars at each position of mechanical interconnection with a carrier tape by a transversely extending interconnecting means, the tape separating plate may be formed with a plurality of front edges transversely spaced apart to independently mechanically interact with respective connector bars to simultaneously function in effecting separation.

Figure 18:
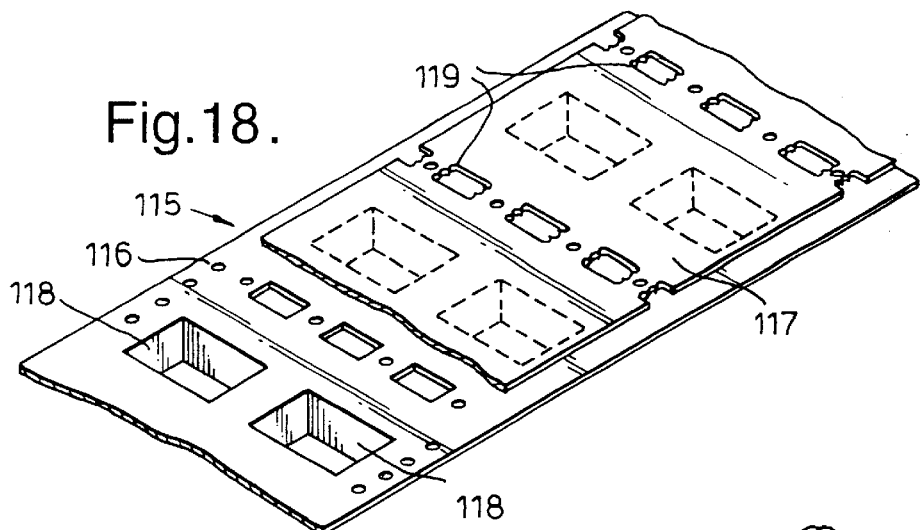
FIG. 18 is a perspective view of an indeterminate length of a modified form of a tape-form packaging system embodying this invention.

Only a single row of article-receiving pockets is shown in the previously illustrated and described embodiments of this invention. A modified tape-form packaging system 115 embodying this invention and comprising elongated carrier and cover tapes 116, 117 disposed in superposed relationship is diagramatically illustrated in FIG. 18. This modified packaging system includes a plurality of parallel disposed rows of pockets 118 extending in longitudinally aligned, spaced apart relationship. A single cover tape mechanically interconnected with the carrier tape by interconnecting means 119 similar to that which has been previously described is provided and is operative with all of the rows of the pockets. Each interconnecting means 119 extends transversely across the tapes and is interposed between adjacent sets of transversely aligned pairs of pockets. Alternatively, a separate cover tape could be provided for each respective row of pockets. This alternate multiple cover tape construction is not shown as its structure is readily understood. Assembly of this modified tape system 115 may be accomplished utilizing a tape assembly mechanism such as that shown in FIGS. 10–14 and previously described with reference to those drawings. A tape separating mechanism similar to that previously described with respect to FIGS. 15, 16 and 17 may be utilized with these tape modifications. A tape separating mechanism embodying that design and incorporating similar tape separation plates may be constructed so as to be capable of concurrently separating all of the cover tapes from the carrier tape or to independently separate each cover tape from the carrier tape.

Figure 19:
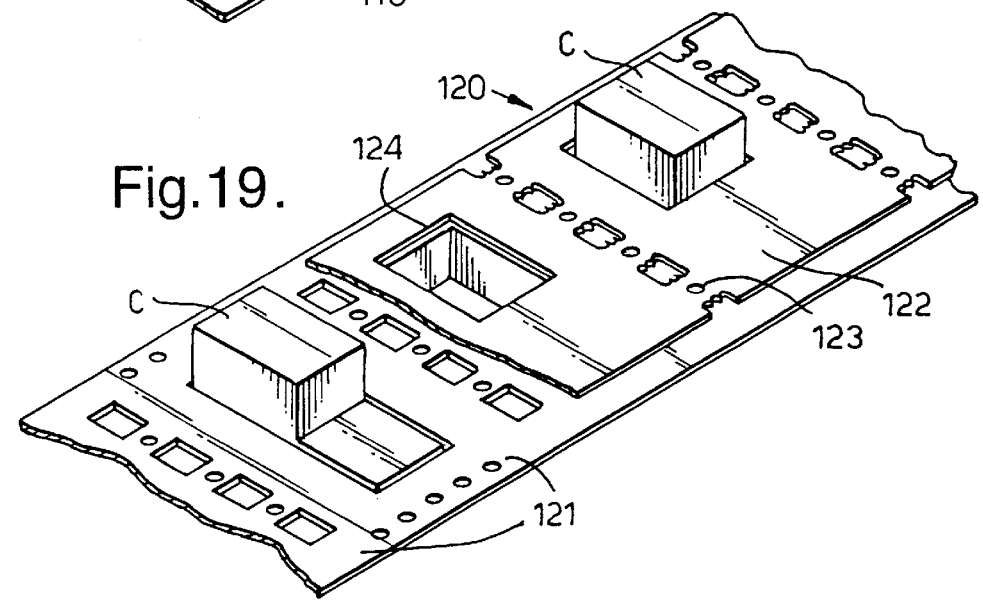
FIG. 19 is a perspective view of an indeterminate length of another modification of a tape-form packaging system embodying this invention.

While the embodiments of this invention previously illustrated and described have been of a structural shape in which the cover tape is of a flat, planar configuration, it has been previously noted in this specification that the cover tape may be otherwise configured. For example, a modified packaging system 120 embodying this invention is shown in FIG. 19 and includes carrier and cover tapes 121, 122 disposed in superposed relationship. These tapes are mechanically interconnected by interconnecting means 123 such as that which has been previously illustrated and described with reference to other embodiments of this invention. This cover tape is formed with a plurality apertures 124 disposed in longitudinally spaced relationship with an aperture positioned to coincide with each respective article-receiving pocket 125 formed in the carrier tape. The purpose of such apertures is to enable the tape combination to accomodate articles C of unique shapes such as those having a base section C-1 which is of a configuration to fit within a respective pocket 125 formed in the carrier tape 121. Integrally formed with the base section of each article C is a projection P extending a distance upwardly from the top peripheral surface of that article. This projection P extends through the aperture 124 thereby enabling the cover tape to be fabricated in a flat, planar configuration and to be disposed in overlying, contacting engagement with the upper surface of the carrier tape. Assembly of the two tapes may be effected utilizing an assembly mechanism such as that previously shown in FIGS. 10–14 and described with respect thereto. It may also be possible to utilize a tape separating mechanism similar to that shown in FIGS. 15–17 and described with reference to those drawing figures. But, a separating mechanism for this FIG. 19 embodiment of the packaging system may require some modification from that previously shown to best function with the configuration of a particular projection P and its positioning on the base C-1 of the respective article C. One modification of the FIG. 19 embodiment that is of expected construction is provision of a plurality of apertures in the cover tape to accomodate an article having a plurality of axially spaced apart projections necessitating a corresponding number of apertures in the cover tape. Modifications in structure or configuration are not shown as they would be apparent to one having ordinary skill in this art and giving due consideration to a specific projection's configuration and positioning.

Figure 20:
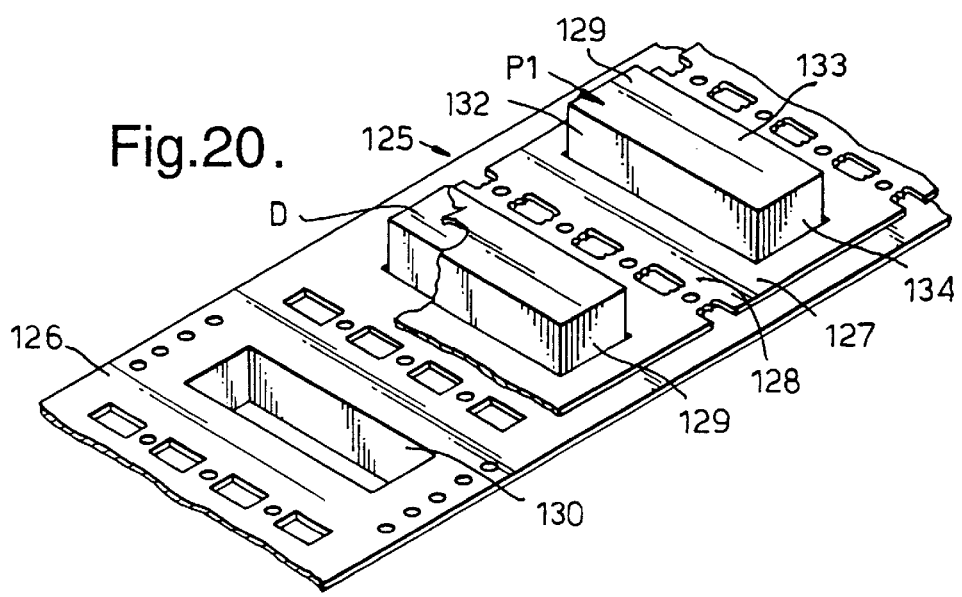
FIG. 20 is a perspective view of a modification of the tape-form packaging system shown in FIG. 19.

A cover tape 117 constructed as shown in FIG. 19 and merely having an aperture 124 through which an article's projection extends has the disadvantage of not providing physical protection for that projection. For packaging of articles having projections which also require physical protection, a tape-form packaging system 125 embodying this invention but capable of accomplishing that objective is shown in FIG. 20. This embodiment also comprises elongated carrier and cover tapes 126, 127 disposed in superposed relationship and mechanically interlocked into a unitary packaging system by transversely extending interconnecting means 128. This interconnecting means is similar to such means which is shown in the previously described embodiments of this packaging system. Since it functions in the same manner, it will not be described in further detail. Carried by the cover tape are a plurality of upwardly projecting shells 129 disposed in longitudinally spaced relationship to have a shell located at a position which coincides with a respective pocket 130 formed in the carrier tape.

As in the case of the previously described and illustrated embodiments of these packaging systems, there are a plurality of pockets 130 formed in the carrier tape 126 in longitudinally aligned and spaced apart relationship. Each pocket is of a size and shape to cooperatively receive a base portion D-1 of a respective article D which is constructed with a projection P-1 that extends upwardly from the top surface of the article's base portion D-1. The projections P-1 are of a length to extend a distance above the upper face of the planar portions 131 of the cover tape 127. The shells 129 are of a configuration and located at a transverse position to receive the upwardly extending projections P-1 of an article D. In the illustrative embodiment 125 shown in FIG. 20, the shells are of a relatively short length thus extending only partially in a transverse direction across the cover tape. These illustrative shells 129 are integrally formed in the cover tape 127 resulting in formation of a unitary cover tape structure. Each shell is formed with transversely extending side walls 132 that are spaced apart a sufficient distance to receive the projection P-1 therebetween. These walls extend above the planar portion 131 of the tape a distance such that a horizontal top wall 133 interconnecting the upper ends of the vertically disposed side walls 132 results in a U-shaped cover providing protection for the article's projection P-1. An end wall 134 integrally formed with the side walls 132 and top wall 133 may be provided at each end of the U-shaped structure thereby resulting in box-shaped shell 129 providing full protection for the article's projection P-1.

As shown in FIG. 20, an interconnecting means 128 is placed between each pair of longitudinally adjacent pockets 130 to effect mechanical interlocking of the carrier and cover tapes 126, 127. Assembly or separation of these tapes may be effected utilizing respective apparatus such as has been described but incorporating structural or dimensional modifications as may be dictated by a particular application.

It will be apparent that a skilled artisan will readily discern structural modifications that may be made in the structure of the modified packaging system 125 to best meet the requirements for optimum packaging of specific articles. For example, the shells 129 may be of a cross-sectional shape other than rectangular, be provided with or without end walls 134 or a top wall 133, be of various transverse lengths, or provided as a plurality of shells at a particular pocket but in transversely spaced apart relationship. Also, the shells and cover tape need not be integrally formed. They may be formed as separate elements that are then assembled by means of mechanical interconnection.

Figure 21:
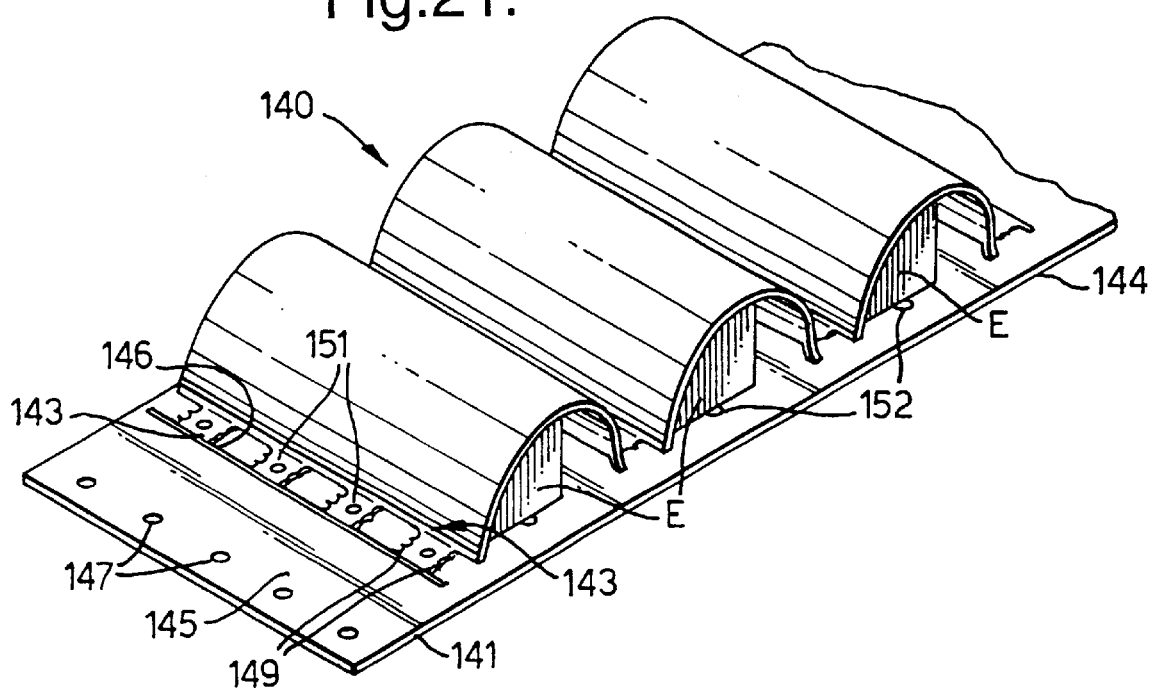
FIG. 21 is a perspective view of an indeterminate length of a further modification of a tape-form packaging system embodying this invention.
Figure 22:
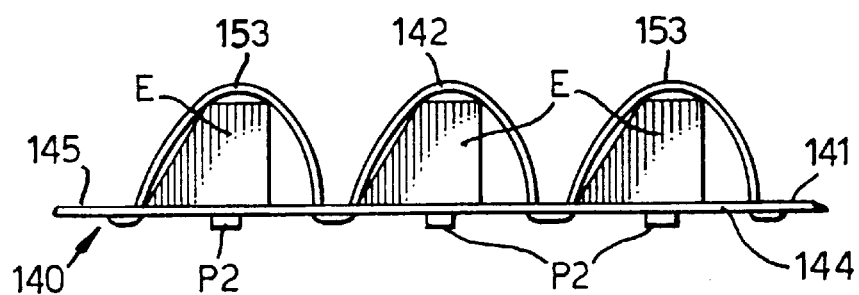
FIG. 22 is a side elevational view of the packaging system shown in FIG. 21.

FIGS. 21 and 22 illustrate a variation of a tape-form packaging system 140 embodying this invention which combines the features of the basic invention, namely, the tape interconnecting means shown in the previously illustrated and described forms of this packaging system, and the shell-type cover tape utilized with the tape system illustrated in FIG. 20. This packaging system 140 includes a carrier tape 141 and a cover tape 142 which are assembled together by interconnecting means 143 that is similar in structure and function to such means as has been shown and described with respect to the other embodiments.

The carrier tape 141 comprises an elongated, planar, strip-form plastic tape of indeterminate length having longitudinally extending side edges 144 disposed a predetermined distance apart in transversely aligned relationship. It has an upper surface 145 on which the cover tape 142 is positioned. Formed in the carrier tape at longitudinally spaced intervals are sets of rectangular apertures 146 disposed in spaced apart, transversely aligned relationship and which form one part of each respective interconnecting means 143. Also formed in the carrier tape in transversely aligned relationship are a plurality of circular apertures 147. These circular apertures are relatively positioned to cooperatively receive a respective one of the positioning protuberances carried on the backup plate of an assembly mechanism similar to that shown in FIGS. 10–14.

Forming the cooperative component of the interconnecting means 143 in the cover tape 142 are a plurality of connector bars 148 that are provided at each opposed side with a locking tab 149. Each connector bar is transversely spaced from a next adjacent bar and is located at a position to coincide with a respective one of the rectangular apertures 146 formed in the carrier tape 141 and into which the bar is to be partially projected in displacing the locking tabs to a position underlying the carrier tape. This positioning of the tabs is best seen in FIG. 22. The tabs lie flat against the bottom surface 150 of the carrier tape 141 thereby effecting mechanical interlocking of that tape with the cover tape 142. A circular aperture 151 is formed centrally in each of the bars 148 to cooperatively interfit with a downwardly projecting pin on an interlocking fork of a tape assembly mechanism typical of that illustrated in FIGS. 10–14 and previously described. Operation of such mechanism in association with a packaging system 140 is functionally the same as was described with reference to FIGS. 10–14.

This tape-form packaging system 140 illustrates a modified form wherein the cover tape 142 is configured to substantially encase each of the articles E in its entirety and in independent relationship to other articles which may be similarly configured. These articles are diagrammatic illustrations of actual articles with which this packaging system is designed to be utilized. The articles may be characterized as being of elongated, block form and of a length that is nearly equal to the transverse width of the carrier tape 141 and having cross-sectional configuration that approximates or will fit within the trapezoidal shape shown in FIG. 22. These articles E are shown as including a plurality of projections P-2 of pin-like form that extend a distance downwardly from a base surface of the article resting on the upper surface 145 of the carrier tape. Apertures 152 of a size to permit passage of the projections P-2 therethrough are formed in the carrier tape at appropriate positions. These apertures are positioned at appropriate locations and perform the function of the pockets incorporated in the previously described tape-form packaging systems. They perform the function of stabilizing the position of the articles on the carrier as to relative movement thereon, either transversely or longitudinally.

Retention of the articles E against vertical displacement relative to the carrier tape 141 is effected by the cover tape 142. In this embodiment the cover tape is formed into a series of loops 153 which are oriented in transverse relationship to the longitudinal axes of the carrier and cover tapes. These loops are of elongated, open ended configuration and are of a cross-sectional shape and size to fit over the articles E in relatively close conformity and in partial contacting engagement thereby operative to maintain the articles in a seated position on the upper surface 145 of the carrier tape. The loops 153 thus perform the function of the cover plates described with respect to the flat pack type of packaging system shown in FIGS. 1–9. Interconnection of adjacently disposed loops is effected by the connector bars 148 which, in this illustrative embodiment, are shaped in relatively narrow, upwardly opening, U-shaped loops. When the tapes are assembled, the bottom terminal ends of these U-shaped loops which comprise the connector bars 148 project through respective ones of the rectangular apertures 146 in the carrier tape 141 to the extent necessary to enable the tabs 149 to underlie the bottom surface 150 of the carrier tape in contacting engagement therewith. Thus, the stitchlock tape interlocking means 143 effects mechanical interconnection of the carrier and cover tapes 141 and 142 thereby forming a packaging system embodying this invention containing the articles E.

Disassembly of the carrier and cover tapes may be accomplished by various techniques including that of physically pulling the tapes apart thereby striping the locking tabs 149 out of the respective apertures 146 in the carrier tape. It is also possible to utilize a separating mechanism incorporating the principles of such mechanism as is shown in FIGS. 15, 16 and 17 and described with respect to those figures. Modifications in the separating plate may be deemed appropriate for the most effective and efficient operation with the tape-form packaging system 140 shown FIGS. 21 and 22.

A further modification of the tape structure is incorporated in the embodiments shown in FIGS. 18 through 22. This further modification resides in the respective interconnecting means 119, 123, 128 and 143 of each of those embodiments. Since this modification is the same in each of those embodiments, a specific description is made only with reference to the embodiment shown in FIGS. 21 and 22. A major objective of this modification is enhancement of the interlocking means' strength in connecting the carrier to the cover tape. This additional interlocking strength is effected by providing two locking tabs 119 at the sides of the connector bars 148 in the region that is at least initially projected through a respective aperture in the carrier tape. With two locking tabs disposed in underlying relationship to the bottom surface 150 of the carrier tape, the locking strength is increased. This is advantageous when the article is of larger size or heavier, such as in the case of the embodiment shown in FIGS. 21 and 22, or there are a plurality of articles disposed in transverse alignment at a particular position.

From the foregoing description of the several embodiments referenced to the respective drawings it will be readily apparent that a novel tape-form packaging system is provided. It has a unique "stitchlock" interconnectng means that minimizes the vertical spacing of the carrier and cover tapes at their point of interconnection as well as providing a secure mechanical connection. Assembly and disassembly of the two tapes is greatly facilitated by the respective assembly and disassembly mechanisms.

Having thus described this invention, We claim:

1. A tape-form packaging system comprising:

A. a strip-form carrier tape of indeterminate length with transversely spaced apart longitudinally extending, parallel side edges and an upper planar surface extending between said side edges formed from a suitable material of selected thickness and exhibiting predetermined characteristics of structural rigidity to provide physical support for articles to be carried thereby and flexibility to be trained around an axis disposed transversely to the longitudinal axis of said carrier tape, said carrier tape having article retaining means integrally formed therewith in seriatim relationship with adjacent article retaining means disposed in relatively spaced apart relationship along said carrier tape's longitudinal axis, each of said article retaining means including a pocket configured to receive an article therein and having a top which opens at the upper planar surface of said carrier tape for enabling an article to be inserted into or removed from a pocket;

B. an elongated cover tape formed of a plurality of planar plates mechanically interconnected in serial relationship and adapted to be disposed in coplanar, superposed longitudinal axially aligned relationship to said carrier tape's upper surface with the opposed surfaces of said carrier tape and the plates of said cover tape disposed in contacting engagement and cooperating with said carrier tape's article retaining means pockets in effecting retention of articles in packaged relationship, said cover tape being formed from a material in a thickness to exhibit a characteristic flexibility that is at least equal that of said carrier tape to enable said cover tape to conform to said carrier tape's upper surface; and C. a plurality of sets of interconnecting means for releasably securing of said carrier and cover tapes together into a unitary assembly with at least one set of said interconnecting means positioned interposed between selected pairs of adjacently disposed article retaining means formed in said carrier tape, each set of said interconnecting means including first and second components that are each integrally formed with a respective one of said carrier and cover tapes and cooperatively mechanically interengage to function in securing said tapes together, said first component including at least one aperture formed in said carrier tape, said aperture having elongated side edges disposed a predetermined distance apart in opposed relationship extending transversely across said carrier tape and opposed end edges extending longitudinally of said carrier tape between said side edges, and said second component includes at least one connector bar extending longitudinally of said cover tape between adjacently disposed plates and enabling said plates to lie in coplanar relationship to the upper surface of said carrier tape and in alignment with said carrier tape aperture and of a length substantially equal to the spacing between said aperture's side edges, said connector bar having opposed side edges spaced apart a distance substantially equal to the transverse width of said aperture whereby said bar may be projected through said aperture with the bar's side edges being closely adjacent said aperture's end edges, said bar having at least one tab formed in coplanar relationship therewith along a respective one of said bar's side edges and projecting a sufficient distance laterally outward therefrom to extend beyond the adjacent side edge of that aperture to underlie said carrier tape when said interlocking means components are in assembled relationship.

2. A packaging system according to claim 1 wherein said cover tape includes longitudinally extending side edges and is of a transverse width less than that of said carrier tape, said cover tape being positioned on said carrier tape with each of its side edges being spaced a predetermined distance transversely inward of a respective side edge of said carrier tape.

3. A packaging system according to claim 1 wherein said bar is formed with at least one second tab at said bar's other side edge, said second tab being disposed in diametrically opposed relationship to said other tab and operationally functional in the same manner.

4. A packaging system according to claim 1 wherein said tab is of a triangular shape in plan view having the base thereof formed with the respective side edge of said bar.

5. A packaging system according to claim 1 which includes a plurality of sets of said interconnecting means interposed in spaced apart, transversely aligned relationship between each of said selected pairs of adjacently disposed article retaining means.

6. A packaging system according to claim 5 wherein each of said sets of interconnecting means is positioned in a predetermined location relative to said article retaining means.

7. A packaging system according to claim 6 wherein all of said sets of interconnecting means disposed in transverse alignment between a selected pair of adjacently disposed pair of article retaining means are located within the transverse extent of those article retaining means.

8. A packaging system according to claim 1 wherein said carrier tape's article retaining means comprises a plurality of article receiving pockets that are each configured to at least partially contain a respective article.

9. A packaging system according to claim 8 wherein said cover tape includes a plurality of article securing means integrally formed therewith at locations which each coincide with a respective one of said carrier tape pockets and cooperatively interengage with an article positioned in a pocket to maintain the article in said pocket.

10. A packaging system according to claim 9 wherein said article securing means includes a loop integrally formed in said cover tape at the location of each of said article receiving pockets, each of said loops extending transversely to the longitudinal axis of said tapes and of a configuration to extend over a respective article and maintain the article in association with the associated article receiving pocket.

11. A tape-form packaging system according to claim 1 in combination with a tape assembly mechanism positioned at a fixed tape assembly position located along a predetermined path traversed by said tapes in parallel relationship to the tape's longitudinal axes and which is selectively operable in cooperation with a carrier tape and a cover tape disposed in superposed relationship to effect mechanical interconnection of said first and second components of each set of said interconnecting means when that particular set of interconnecting means is located at said tape assembly position, and tape displacing means operable to effect displacement of said tapes along said path in incremental advancement through said tape assembly mechanism with respect to said tape assembly position for sequentially positioning each set of interconnecting means at said assembly position for a time period sufficient for said assembly mechanism to effect assembly of that set of interconnecting means.

12. A tape-form packaging system according to claim 1 in combination with a tape separating mechanism for effecting unlocking of said tape interconnecting means whereby said carrier and cover tapes can be separated from each other enabling removal of articles from their respective pockets, and tape displacing means supported in operative engagement with said tapes at a separating station and operable to effect displacement of said tapes along a path in parallel relationship to the longitudinal axes of the tapes and through said tape separating mechanism, said tape separating mechanism positioned at a fixed location along the path of movement of said tapes and including a planar separating plate supported by said separating mechanism in a position to project between said carrier and cover tapes when they are disposed in superposed relationship and to effect their relative separation from each other when the combined tapes are displaced along their longitudinal axes past said separating station by disconnecting the interconnecting means in sequence, said separating plate having a leading edge that first engages the two tapes as they approach the separating station and is interjected between the two tapes.

13. A tape-form packaging system in combination with a tape separating mechanism according to claim 12 wherein said tape separating mechanism includes a supporting frame mounted in a fixed location at said separating station along the longitudinal path traversed by said tapes adjacent the position where the articles are to be dispensed for utilization, said supporting frame including a component disposed in laterally offset relationship to one of the longitudinal side edges of said carrier tape, said tape separating plate secured to said supporting frame to extend in coplanar relationship relative to and between said superposed tapes to effect their separation into spaced apart relationship by disengaging respective components of the interconnecting means from each other.

14. A tape-form packaging system in combination with a tape assembly mechanism according to claim 13 wherein each connector bar is formed with a position holding aperture in alignment with a respective carrier tape's locking aperture; each said plunger on said interlocking fork blade having an axially outward extending position holding pin adapted to cooperatively project through a respective connector bar's position holding aperture in interfitting engagement.

15. A tape-form packaging system in combination with a tape assembly mechanism according to claim 14 wherein said carrier tape has a plurality of stabilizing apertures formed therein in spaced apart, transverse alignment with respect to each set of interconnecting means with a stabilizing aperture positioned a distance transversely away from each side of a respective locking aperture, and said backup plate having a plurality of support blocks formed on said upper edge thereof in upwardly extending relationship whereby their upper ends form said support surfaces adapted to engage the lower surface of said carrier tape, said support blocks disposed in spaced relationship with each block positioned in alignment with a respective stabilizing aperture and of a cross-sectional configuration to avoid interference with assembly of said interconnecting means, each of said support block surfaces has an axially extending protuberance adapted to interfit into a respective stabilizing aperture and restrict lateral displacement of said carrier tape.

16. A tape-form packaging system;
  A. a strip-form carrier tape of indeterminate length with transversely spaced apart, longitudinally extending parallel side edges and an upper planar surface extending between said side edges formed from a suitable material of selected thickness and exhibiting predetermined characteristics of structural rigidity to provide physical support for articles to be carried thereby and flexibility to be trained around an axis disposed transversely to the longitudinal axis of said carrier tape, said carrier tape having article retaining means integrally formed therewith in seriatim relationship with adjacent article retaining means disposed in relatively spaced apart relationship along said carrier tape's longitudinal axis, each of said article retaining means including a pocket configured to receive an article therein and having a top which opens at the upper planar surface of said carrier tape for enabling an article to be inserted into or removed from a pocket;
  B. an elongated cover tape formed of a plurality of planar plates mechanically interconnected in serial relationship and adapted to be disposed in coplanar, superposed longitudinal axially aligned relationship to said carrier tape's upper surface with the opposed surfaces of said carrier tape and the plates of said cover tape disposed in contacting engagement and cooperating with said carrier tape's article retaining means pockets in effecting retention of articles in packaged relationship, said cover tape being formed from a material in a thickness to exhibit a characteristic flexibility that is at least equal that of said carrier tape to enable said cover tape to conform to said carrier tape's upper surface; and
  C. a plurality of sets of interconnecting means for releasably securing of said carrier and cover tapes together into a unitary assembly with at least one set of said interconnecting means positioned interposed between selected pairs of adjacently disposed article retaining means formed in said carrier tape, each set of said interconnecting means including first and second components that are each integrally formed with a respective one of said carrier and cover tapes and cooperatively mechanically interengage to function in securing said tapes together, said first component including at least one aperture formed in said carrier tape, said aperture having elongated side edges disposed a predetermined distance apart in opposed relationship extending transversely across said carrier tape and opposed end edges extending longitudinally of said carrier tape between said side edges, and said second component includes at least one connector bar formed in said cover tape and extending longitudinally thereof and positioned in alignment with said carrier tape's aperture and of a length substantially equal to the spacing between said aperture's side edges, said connector bar having opposed side edges spaced apart a distance substantially equal to the transverse width of said aperture whereby said bar may be projected through said aperture with the bar's side edges being closely adjacent said aperture's end edges, said bar having at least one tab formed in coplanar relationship therewith along a respective one of said bar's side edges at essentially its midlength and projecting a sufficient distance laterally outward thereof to extend beyond the adjacent side edge of that aperture to underlie said carrier tape when said interlocking means components are in assembled relationship.

17. A tape-form packaging system in combination with a tape assembly mechanism according to claim 16 wherein each of said plungers is configured with the lower marginal end portion thereof inwardly convergent with respect to each of their transversely extending side walls to a reduced width that is less than the longitudinal width of a carrier tape's locking aperture to facilitate its projection through said locking aperture.

18. A tape-form packaging system in combination with a tape assembly mechanism according to claim 17 wherein said plungers are arcuately configured at their terminal end about their transverse axis.

19. A tape-form packaging system according to claim 1 in combination with a tape separating mechanism for effecting unlocking of said tape interconnecting means whereby said carrier and cover tapes can be separated from each other enabling removal of articles from their respective pockets, and tape displacing means supported in operative engagement with said tapes and operable to effect displacement of said tapes along a path in parallel relationship to the longitudinal axes of the tapes and through said tape separating mechanism, said tape separating mechanism positioned at a fixed location along the path of movement of said tapes.

20. A tape-form packaging system in combination with a tape separating mechanism according to claim 19 wherein said tape separating mechanism includes a supporting frame mounted in a fixed location along the longitudinal path traversed by said tapes adjacent the position where the articles are to be dispensed for utilization, said supporting frame including a component disposed in laterally offset relationship to one of the longitudinal side edges of said carrier tape, and a tape separating plate secured to said supporting frame to extend in coplanar relationship relative to and between said superposed tapes to effect their separation into spaced apart relationship whereby the respective components of an interconnecting means are disengaged from each other.

21. A tape-form packaging system comprising:
  A. a strip-form carrier tape of indeterminate length with transversely spaced part, longitudinally extending parallel side edges and an upper planar surface extending between said side edges formed from a suitable material of selected thickness and exhibiting predetermined characteristics of structural rigidity to provide physical support for articles to be carried thereby and flexibility to be trained around an axis disposed transversely to the longitudinal axis of said carrier tape, said carrier tape having article retaining means integrally formed therewith in seriatim relationship with adjacent article retaining means disposed in relatively spaced apart relationship along said carrier tape's longitudinal axis;

B. an elongated cover tape adapted to be disposed in superposed relationship to said carrier tape's upper surface and cooperating with said carrier tape's article retaining means in effecting retention of articles in packaged relationship, said cover tape being formed from a material in a thickness to exhibit a characteristic flexibility that is at least equal to that of said carrier tape to enable said cover tape to conform to said carrier tape's upper surface;

C. a plurality of sets of interconnecting means for releasably securing of said carrier and cover tapes together into a unitary assembly with at least one set of said interconnecting means positioned interposed between selected pairs of adjacently disposed article retaining means formed in said carrier tape, each set of said interconnecting means including first and second components that are each integrally formed with a respective one of said carrier and cover tapes and cooperatively mechanically interengage to function in securing said tapes together, said first component including at least one aperture formed in said carrier tape, said aperture having elongated side edges disposed a predetermined distance apart in opposed relationship extending transversely across said carrier tape and opposed end edges extending longitudinally of said carrier tape between said side edges, and said second component including at least one connector bar formed in said cover tape and extending longitudinally thereof and positioned in alignment with said carrier tape's aperture and of a length substantially equal to the spacing between said aperture's side edges, said connector bar having opposed side edges spaced apart a distance substantially equal to the transverse width of said aperture whereby said bar may be projected through said aperture with the bar's side edges being closely adjacent said aperture's end edges, said bar having at least one tab formed in coplanar relationship therewith along a respective one of said bar's side edges at essentially its midlength and projecting a sufficient distance laterally outward therefor to extend beyond the adjacent side edge of that aperture to underlie said carrier tape when said interlocking means components are disposed in assembled relationship.

22. A tape-form packaging system comprising:

A. a strip-form carrier tape of indeterminate length with transversely spaced part, longitudinally extending parallel side edges and an upper planar surface extending between said side edges formed from a suitable material of selected thickness and exhibiting predetermined characteristics of structural rigidity to provide physical support for articles to be carried thereby and flexibility to be trained around an axis disposed transversely to the longitudinal axis of said carrier tape, said carrier tape having article retaining means integrally formed therewith in seriatim relationship with adjacent article retaining means disposed in relatively spaced apart relationship along said carrier tape's longitudinal axis;

B. an elongated cover tape adapted to be disposed in superposed relationship to said carrier tape's upper surface and cooperating with said carrier tape's article retaining means in effecting retention of articles in packaged relationship, said cover tape being formed from a material in a thickness to exhibit a characteristic flexibility that is at least equal to that of said carrier tape to enable said cover tape to conform to said carrier tape's upper surface;

C. a plurality of sets of interconnecting means for releasably securing of said carrier and cover tapes together into a unitary assembly with at least one set of said interconnecting means positioned interposed between selected pairs of adjacently disposed article retaining means formed in said carrier tape, each set of said interconnecting means including first and second components that are each integrally formed with a respective one of said carrier and cover tapes and cooperatively mechanically interengage to function in securing said tapes together, said first component including at least one aperture formed in said carrier tape, said aperture having elongated side edges disposed a predetermined distance apart in opposed relationship extending transversely across said carrier tape and opposed end edges extending longitudinally of said carrier tape between said side edges, and said second component including at least one connector bar formed in said cover tape and extending longitudinally thereof and positioned in alignment with said carrier tape's aperture and of a length substantially equal to the spacing between said aperture's side edges, said connector bar having opposed side edges spaced apart a distance substantially equal to the transverse width of said aperture whereby said bar may be projected through said aperture with the bar's side edges being closely adjacent said aperture's end edges, said bar having at least one tab formed in coplanar relationship therewith along a respective one of said bar's side edges at essentially its midlength and projecting a sufficient distance laterally outward therefor to extend beyond the adjacent side edge of that aperture to underlie said carrier tape when said interlocking means components are disposed in assembled relationship; and D. including in combination therewith a tape assembly mechanism positioned at a fixed tape assembly position located along a predetermined path traversed by said tapes in parallel relationship to the tape's longitudinal axes and which is selectively operable in cooperation with a carrier tape and a mechanical interconnection of said first and second components of each set of said interconnecting means when that particular set of interconnecting means is located at said tape assembly position, and tape displacing means operable to effect displacement of said tapes along said path in incremental advancement with respect to said tape assembly position for sequentially positioning each set of interconnecting means at said assembly position for a time period sufficient for said assembly mechanism to effect assembly of that set of interconnecting means, said tape assembly mechanism comprising an interlocking fork, a backup plate and a supporting frame on which said interlocking fork and said backup plate are mounted at respective opposite sides of the plane of a superposed pair of carrier and cover tapes for relative reciprocating movement in a plane oriented in perpendicular relationship to the planes of said tapes, said supporting frame having actuating means operatively coupled with said interlocking fork and said backup plate to effect relative reciprocation thereof, and control means operatively coupled with said actuating means to effect operation thereof in producing cooperative reciprocation of said interlocking fork and said backup plate, said control means including tape sensing means for detecting the longitudinal position of said tapes and generating a control signal that is transmitted to said control means when said tapes are at a selected position relative to said frame to interrupt longitudinal displacement of said tapes while causing operation of said actuating means, said interconnecting means of said packaging system includes locking apertures formed in said carrier tape and said cover tape includes connector bars having locking tabs fromed therewith that are adapted to cooperatively interlock with a respective locking aperture in said carrier tape; and said interlocking fork includes a blade having a bottom edge provided with a plunger for each connector bar of said cover tape at said tape assembly position, each said plunger being of elongated configuration terminating in a bottom edge that is displaceable into contacting engagement with the upper surface of a respective connector bar and effect displacement thereof through an aligned locking aperture in said carrier tape to position a connector bar's locking tabs into a position underlying said carrier tape, each said plunger being of a cross- sectional shape to interfit into a respective carrier tape locking aperture, said backup plate having support surfaces adapted to be displaced into contacting engagement with said carrier tape at its bottom surface at locations on opposite transverse sides of a respective carrier tape locking aperture to oppose oppositely directed forces exerted by said plunger thereby essentially maintaining said carrier tape planar at a tape assembly station during assembly of a tape interconnecting means.

23. A tape-form packaging system in combination with a tape assembly mechanism according to claim 22 wherein each connector bar is formed with a position holding aperture in alignment with a respective carrier tape's locking aperture; each said plunger on said interlocking fork blade having an axially outward extending position holding pin adapted to cooperatively project through a respective connector bar's position holding aperture in interfitting engagement.

24. A tape-form packaging system in combination with a tape assembly mechanism according to claim 22 wherein said carrier tape has a plurality of stabilizing apertures formed therein in spaced apart, transverse alignment with respect to each set of interconnecting means with a stabilizing aperture positioned a distance transversely away from each side of a respective locking aperture, and said backup plate having a plurality of support blocks formed on said upper edge thereof in upwardly extending relationship whereby their upper ends form said support surfaces adapted to engage the lower surface of said carrier tape, said support blocks disposed in spaced relationship with each block positioned in alignment with a respective stabilizing aperture and of a cross-sectional configuration to avoid interference with assembly of said interconnecting means, each of said support block surfaces has an axially extending protuberance adapted to interfit into a respective stabilizing aperture and restrict lateral displacement of said carrier tape.

25. A tape-form packaging system in combination with a tape assembly mechanism according to claim 22 wherein said connector bars of said cover tape are each formed with a locating aperture positioned at their approximate longitudinal midpoint and a distance laterally inward from their respective longitudinal side edges, each of said interlocking fork plungers having an elongated locating pin of cross-sectional configuration to interfit in close conformity with a respective connector bar locating aperture when inserted therethrough.

26. A packaging system according to claim 24 wherein said tab is of a triangular shape in plan view having the base thereof formed with the respective side edge of said bar.

27. A tape-form packaging system comprising:

A. a strip-form carrier tape of indeterminate length with transversely spaced apart, longitudinally extending parallel side edges and an upper planar surface extending between said side edges formed from a suitable material of selected thickness and exhibiting predetermined characteristics of structural rigidity to provide physical support for articles to be carried thereby and flexibility to be trained around an axis disposed transversely to the longitudinal axis of said carrier tape, said carrier tape having article retaining means integrally formed therewith in seriatim relationship with adjacent article retaining means disposed in relatively spaced apart relationship along said carrier tape's longitudinal axis;

B. an elongated cover tape adapted to be disposed in superposed relationship to said carrier tape's upper surface and cooperating with said carrier tape's article retaining means in effecting retention of articles in packaged relationship, said cover tape being formed from a material in a thickness to exhibit a characteristic flexibility that is at least equal to that of said carrier tape to enable said cover tape to conform to said carrier tape's upper surface; and C. a plurality of sets of interconnecting means for releasably securing of said carrier and cover tapes together into a unitary assembly with at least one set of said interconnecting means positioned interposed between selected pairs of adjacently disposed article retaining means formed in said carrier tape, each set of said interconnecting means including first and second components that are each integrally formed with a respective one of said carrier and cover tapes and cooperatively mechanically interengage to function in securing said tapes together; and wherein said carrier tape's article retaining means comprises a plurality of article receiving pockets that are each configured to at least partially contain a respective article and said cover tape includes a plurality of article securing means integrally formed therewith at locations which each coincide with a respective one of said carrier tape pockets and cooperatively interengage with an article positioned in a pocket to maintain the article in said pocket, and said article securing means comprises an aperture formed in said cover tape at each pocket for receiving a portion of an article projecting upwardly out of a pocket thereby enabling that portion of a respective article to protrude therethrough.

* * * * *